United States Patent [19]

Jacobson

[11] Patent Number: 4,500,993
[45] Date of Patent: Feb. 19, 1985

[54] IN-CIRCUIT DIGITAL TESTER FOR TESTING MICROPROCESSOR BOARDS

[75] Inventor: Robert G. Jacobson, Brentwood, Calif.

[73] Assignee: Zehntel, Inc., Walnut Creek, Calif.

[21] Appl. No.: 379,726

[22] Filed: May 19, 1982

Related U.S. Application Data

[63] Continuation-in-part of Ser. No. 160,562, Jun. 17, 1980, Pat. No. 4,339,819.

[51] Int. Cl.³ .................. G01R 31/28; G06F 11/00
[52] U.S. Cl. ............................ 371/16; 324/73 R; 371/20
[58] Field of Search .......... 324/73 R; 364/580; 371/16, 20, 27

[56] References Cited

U.S. PATENT DOCUMENTS

| | | | |
|---|---|---|---|
| 3,916,178 | 10/1975 | Greenwald | 371/16 |
| 4,125,763 | 11/1978 | Drabing et al. | 371/20 |
| 4,127,768 | 11/1978 | Negi et al. | 371/16 |
| 4,128,873 | 12/1978 | Lamiaux | 371/20 X |
| 4,200,224 | 4/1980 | Flint | 371/16 X |
| 4,216,539 | 8/1980 | Raymond et al. | 371/20 |
| 4,339,819 | 6/1980 | Jacobson | 371/16 |

Primary Examiner—Jerry Smith
Assistant Examiner—Mark Ungerman
Attorney, Agent, or Firm—Arnold, White & Durkee

[57] ABSTRACT

A circuit for use in an in-circuit digital tester for generating data bus and control line test signals to test the electrical performance properties of components in a circuit under test is disclosed. Certain components in a circuit under test, such as microprocessors, are bus oriented devices which perform their functions in predetermined cycles. These cycles have been divided up into control sequences of control signals. Sequences of data signals are also generated. Each test pin in the bed of nails test fixture has a digital test signal generator associated therewith. The present invention operates to program each test signal generator with digital test signal generating data to produce the control and data sequences required to test a device under test during a test cycle. These predetermined sequences in control and data sequences are specified by a sequence in starting addresses of the programmable memory locations containing the selected control and data sequences to be generated.

24 Claims, 12 Drawing Figures

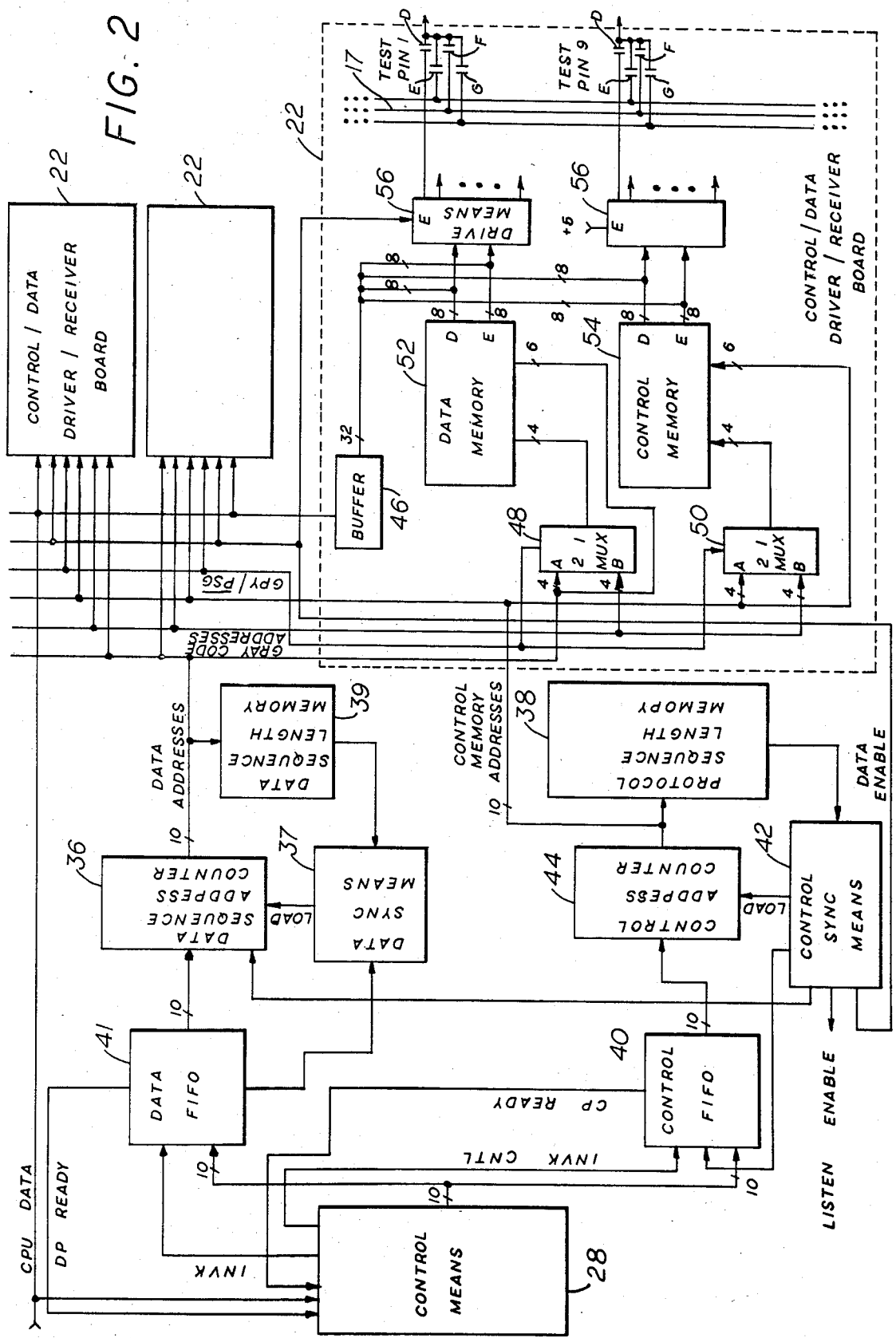

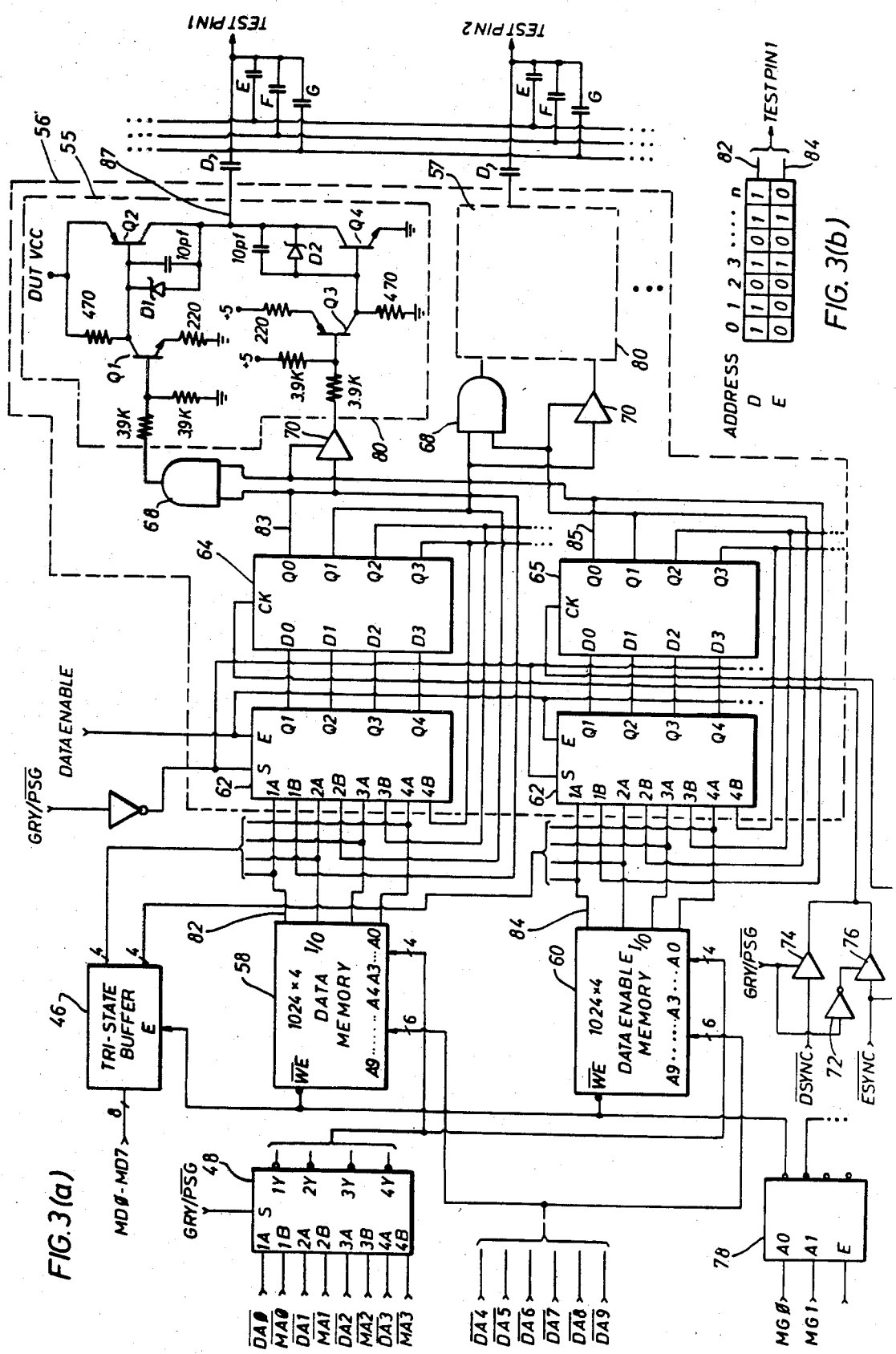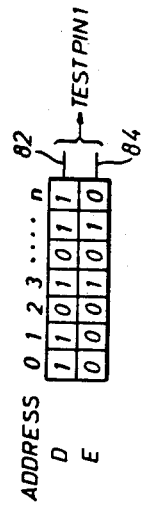
FIG. 3(a)
FIG. 3(b)

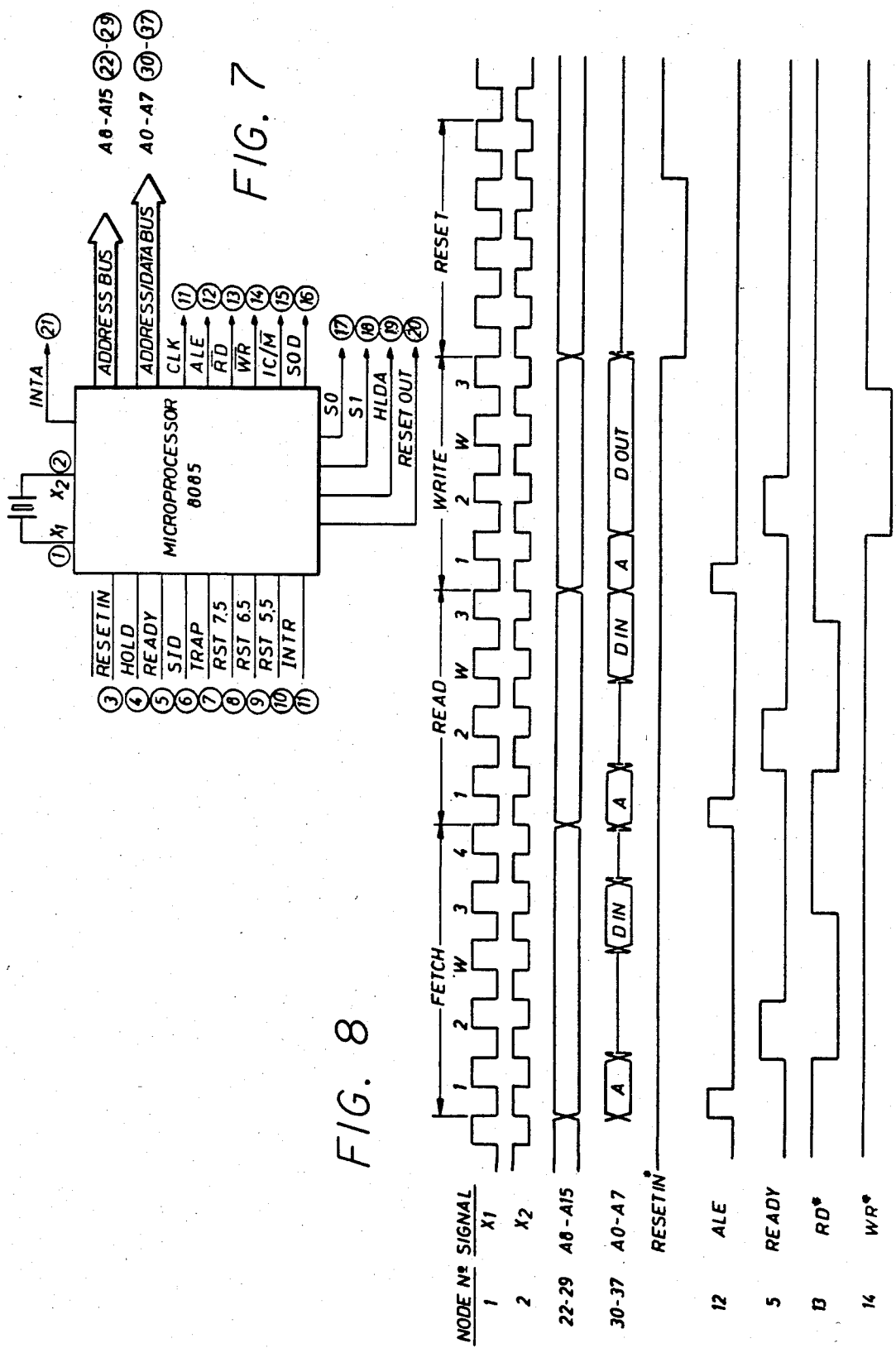

IN-CIRCUIT DIGITAL TESTER FOR TESTING MICROPROCESSOR BOARDS

CROSS-REFERENCE TO RELATED APPLICATION

This application is a continuation-in-part application to co-pending U.S. patent application Ser. No. 160,562, filed June 17, 1980, now issued as U.S. Pat. No. 4,339,819, and entitled "Programmable Sequence Generator for In-Circuit Digital Testing." Both the present application and application Ser. No. 162,562 are assigned to the same assignee.

TABLE OF CONTENTS

BACKGROUND OF THE INVENTION
SUMMARY OF THE INVENTION
BRIEF DESCRIPTION OF THE DRAWINGS
DETAILED DESCRIPTION OF THE PREFERRED EMBODIMENT
  An In-Circuit Digital Tester
  The proctocol Control Sequence/Data Sequence Concept
  The Programmable Sequence Generators
    The Control/Data Driver/Receiver Boards 22
    The Programmable Sequence Controller 18
    The Control Sequence Portion of Controller 18
    The Data Sequence Portion of Controller 18
  A Sample Test Program
WHAT IS CLAIMED

BACKGROUND OF THE INVENTION

This invention relates to in-circuit digital testers. More particular, the invention relates to a circuit for generating test signals for testing bus oriented electronic devices and components, such as microprocessor boards.

As used herein, an in-circuit digital tester refers to a tester that is capable of testing components in devices in a circuit without regard to whether or not the electrical node into which a test signal is applied is connected to the output of another logic device. In-circuit testers are capable of generating and applying a digital test signal to an output node of a logic device that is normally at a logic ground to cause that output to go to a logic high without damaging the device. In other words, the use of the term "in-circuit" means that the device or circuit under test does not have to be isolated or removed from the surrounding circuits in order to apply digital test signals and to monitor its outputs.

Prior-art in-circuit digital testers, such as that disclosed in U.S. Pat. No. 4,216,539, entitled "In-Circuit Digital Tester," provides a programmed memory digital test signal generator associated with each pin in a bed of nails fixture. The test signal generators are capable of generating a wide variety of digital test signals to test components or devices in a circuit under test. (U.S. Pat. No. 4,216,539 is incorporated herein for all purposes.) Some components, however, require an especially complexed test signal pattern generation in order to adequately test the electrical performance characteristics of the component. One such component is a microprocessor chip.

Microprocessors are bus oriented devices. To test a microprocessor chip requires the generation of multi-lined data bus signals. These bus signals usually represent either data or memory addresses. In addition, to properly exercise or set up a data bus signal generation sequence, a sequence of control signals must either precede or be generated concurrently with the data bus signals before the microprocessor can properly execute its internal sequences. Microprocessors execute their instructions using repeated selected signal sequences, such as an instruction fetch cycle, a read from memory cycle, a write to memory cycle, etc. To test microprocessors, complex and lengthy test patterns generated simultaneously at a plurality of input and output points of the circuit are required. This requirement of complex test patterns simultaneously at several input points is true for other logic devices, such as UARTs, programmed I/O devices, etc.

Testing of a microprocessor and the devices associated therewith, i.e., a microprocessor board, is best accomplished by simulating the operations of the microprocessor programmed in a specific manner. In this way, operations of the microprocessor can be checked, and by making the microprocessor function in a specific manner through execution of its own instructions, external devices, such as RAM and ROM memories connected to the microprocessor's bus can also be tested. But, to accomplish this task using prior-art stored memory test signal generators to generate the test signals would require an unmanageable and cost prohibitive amount of programmable memory in each test signal generator.

To solve the problem of generating these complexed test signal patterns while utilizing the advantages and novelty over the prior-art for in-circuit digital testers offered by the invention disclosed in the application incorporated above, the present invention has segregated the test signals for bus oriented devices into two categories—data bus sequences of test signals and protocol control sequences of test signals.

The data bus test signals are applied as parallel words onto the multi-lined data buses. When testing a microprocessor device this data will represent either data or memory addresses. A data sequence of data bus signals is defined according to the present invention as a sequence of signals generated from the programmable memory test signal generators associated with the data bus, starting at a predetermined starting address and ending at a predetermined last address.

For certain logic devices, such as microprocessors, a plurality of individual control signals are required in parallel and timed relationship to each other such that when all the control signals are viewed in parallel, they define a protocol sequence of control test signals which communicate to a device information necessary for the device to perform a normally intended function. For the present invention, the protocol control sequences of control test signals are defined by a starting and a last address of the programmable memory associated with the digital test signal generators which generate the control signals. From these predefined protocol and data sequences, all of the functions of the device may be exercised by recursively generating the sequences as required to test each function of the device by specifying the starting and last addresses for each sequence.

SUMMARY OF THE INVENTION

In accordance with the present invention, a circuit for use in an in-circuit digital tester for generating data bus and control input test signals to test bus oriented electrical components of a circuit under test is disclosed. The circuit is comprised of a data memory for storing data bus test signal generating data for generating data sequences of data bus test signals in a plurality of data bus signal lines. The data bus signal generating data is outputted from the data memory in response to a predetermined sequence of data memory addresses. Each data sequence is defined by a starting and a last data memory address.

A control memory is also provided for storing control line test generating data for a plurality of protocol sequences in which each protocol sequence is defined by a plurality of control line test signals. The control line test signals will be generated in response to a predetermined sequence of control memory addresses. Each protocol sequence stored in the control memory begins with a starting address and ends at a last memory address.

To generate the predetermined sequences in the addresses applied to the data memory and to the control memory, a control means is provided. The control means generates selected ones of the protocol and data sequences by generating a predetermined sequence of starting addresses for the control and data memories. The control means further selectively enabling the generation of the data bus signals specified by the data bus test signal generating data stored in the data memory during a selected data sequence.

The control means is comprised of a programmed processor including a random access memory unit for storing instructions which, when executed by said processor, will output the predetermined sequence of starting addresses of the protocol and data sequences to be generated. The control means further includes a buffer memory unit connected to the output of the processor for temporarily storing and outputting, in the same sequence as outputted by the processor, the starting addresses of the protocol sequences. A buffer memory is also provided for the starting addresses of the data sequences. Each buffer memory unit generates a ready command signal to the programmed processor unit when the buffer memory unit is not full. The control means further includes a control memory address counter, a protocol sequence length memory, a data memory address counter, a data sequence length memory and synchronization means for both the control and data sequences.

The control memory address counter responds to the output from the control buffer memory to generate the control memory addresses. The protocol sequence length memory responds to the control memory addresses to output enabling signals that will enable the generation of the predetermined sequences of control and memory addresses. The enable signals include a last address signal to enable the control memory address counter to load the next control sequence starting address from the control buffer memory; a data memory enable signal to selectively enable the data memory to generate the data bus test signals; and a data memory address advance signal to enable said data memory address counter to advance to the next data memory address in the predetermined sequence of data memory addresses. The data memory address counter responds to said sequence length memory enable signals to generate the data memory addresses.

A data sequence length memory responds to the data memory addresses to output a last data sequence address signal to terminate the generation of the sequence of data memory addresses for a selected data sequence. The function of the control and data synchronization means is to respond to the last address signal from the control and data sequence length memories to respectively update the control memory address counter and the data memory address counter with the starting address of the next protocol and data sequence to be generated.

The present invention is intended to be used in an in-circuit digital testing system adapted for use with a central processing unit in which the in-circuit tester includes a response signal line from monitoring a digital response test signal from a circuit under test. Also included is a functional tester, a set of test pins for contacting the electrical nodes of the circuit under test, a plurality of programmed-memory digital test-signal generators and a response signal selecting means. The functional tester performs functional tests on the signal that appears on the response signal line during a test cycle. The results of the functional test are analyzed by the central processor to determine the electrical performance properties of the components of the circuit under test.

The set of test pins are used to contact selected electrical nodes of the circuit under test to provide the input and output signal points of the circuit under test. An independently programmable-memory digital test-signal generator is associated with each test pin in the set of test pins. Each generator is capable of generating an input signal-point digital test signal for the circuit under test. The response signal selecting means selectively connects the signal on one of the test pins to the response signal line as the response signal for the functional tester.

The present invention is an improvement in the programmable-memory digital test-signal generators in accordance with the features as set forth above.

In another aspect of the invention, a circuit for use in an in-circuit computer controlled digital tester for testing microprocessor boards is disclosed. Testing of the microprocessor board includes testing of the microprocessor itself and of the devices or components associated therewith by simulating the operations of the microprocessor programmed in a specific manner.

The microprocessor operates through a plurality of data bus and control lines. Simulation of the operations of the microprocessor programmed in a specific manner is in accordance with basic operation cycles of the microprocessor, such as fetch cycles, read cycles, write cycles, etc. Each of these basic operation cycles occur in response to a predetermined protocol sequence of control signals input to the microprocessor itself. The specific programming of the microprocessor is accomplished through the generation of predetermined data sequences which provide the necessary information to the microprocessor for the specific instructions simulated.

The circuit includes a control means which responds to the computer to control the generation of the plurality of protocol and data sequences by generating predetermined sequences of memory addresses. A data bus signal generator, responsive to data memory addresses, generates a plurality of data bus signals in the data bus lines. The data bus signal generator includes a data memory for storing generating signals for the data bus signals for each data sequence, where each data sequence is defined from a starting to a last data memory address.

A control signal generator is also included for generating a plurality of protocol sequences of control signals in the control signal lines. A control memory is included in the control signal generator for storing the generating data for the control signals in each protocol sequence. Each protocol sequence is defined from a starting to a last control memory address.

The control means controls the control signal generator to selectively generate, in any desired order, the protocol sequences as a sequence of logic levels in the control signals for each selected protocol sequence. The control means controls the data bus signal generator to selectively generate in any desired order the data sequences as a sequence of logic levels in the data bus signals, where a data sequence is generated in controlled relationship with the control signals generated during a selected protocol sequence thereby to simulate the normal operations of a microprocessor programmed in a specific manner by selectively generating in any order from among the plurality of protocol and data sequences the basic microprocessor operations.

BRIEF DESCRIPTION OF THE DRAWING

For a fuller understanding of the nature and objects of the invention, reference should be had to the following detailed description taken in connection with the accompanying drawings, in which:

FIG. 2 is a more detailed block diagram of the programmable sequence generator and driver/receiver boards of the in-circuit digital tester shown in FIG. 1;

FIG. 3(a) is a more detailed circuit diagram of the data memory and driver means of the driver/receiver boards shown in FIG. 2;

FIG. 3(b) is an illustration of the data and enable bit programming of the data and data enable memories;

FIG. 7 is a block diagram of an 8085 microprocessor showing its control signal and data bus signal pin assignments;

FIG. 8 is a timing diagram of the control and data bus signals for typical operation cycles of the microprocessor illustrated in FIG. 7;

FIG. 9 is a memory map of the control memory and the control sequence length memory illustrating the stored data to generate a specific program for the microprocessor shown in FIG. 7;

FIG. 10 is a memory map of the data memory illustrated in FIG. 2, and shows the stored data for generating a specific program for the microprocessor shown in FIG. 7.

Similar reference numerals refer to similar parts throughout the several views of the drawings.

DETAILED DESCRIPTION OF THE PREFERRED EMBODIMENT

An In-Circuit Digital Tester

Figure 1:
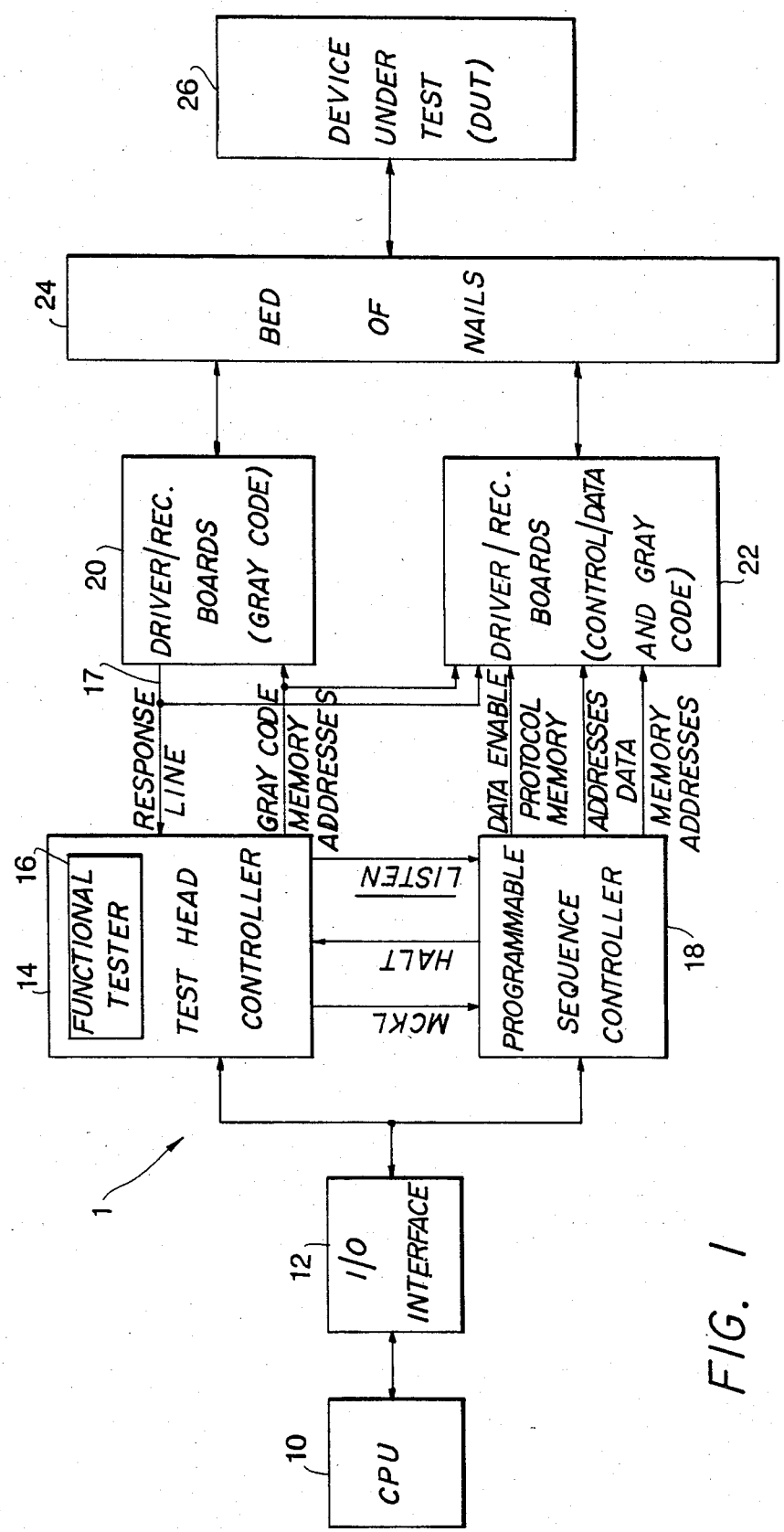
FIG. 1 is a block diagram of an in-circuit digital tester which incorporates the present invention.

Referring to the figures and first to FIG. 1, a functional block diagram of an in-circuit digital tester 1 which includes the present invention is shown. In operation, the in-circuit digital tester 1 generates a test cycle in which selected electrical nodes of a device under test (DUT) 26 are stimulated with preselected digital test signals generated by a plurality of driver/receiver boards 20, 22. The digital test signals generated by the driver/receiver boards are applied to the selected electrical nodes of the DUT 26 through a bed of nails fixture 24 on which the DUT 26 has been placed. Controlling the generation of the digital test signals by the driver/receiver boards 20, 22 is a test head controller 14 and a programmable sequence controller 18.

There are two possible modes of operation of the driver/receiver boards 20, 22, a Gray code mode or a protocol control/data mode. Not all of the driver/receiver boards can operate in the control/data mode, but all of the driver/receiver boards are capable of operating in the Gray code mode. For purposes of discussion, driver/receiver boards 22 are the only boards which can operate in both modes. U.S. Pat. No. 4,216,539, incorporated herein by reference, discloses an in-circuit digital tester which operates with Gray code test signals. The present invention operates in conjunction with that in-circuit digital tester to provide an extension to the digital test signal generation capabilities to accommodate the test signal patterns required to adequately test bus oriented devices and components, such as microprocessor and microprocessor boards. While the present invention is disclosed and discussed in relation to the unique testing capabilities of bus oriented devices, such as microprocessors, the present invention is equally capable of generating test signals for any variety of digital logic device which require complex multi-lined test signals in order to perform their functions. Examples of such other logic devices are Universal Asynchronous Receiver/Transmitters, UARTs, programmable Input/Output devices, etc.

To accommodate the more complex test signal pattern generation requirements of bus oriented devices, a programmable sequence controller 18, operating in association with driver/receiver boards 22, is included in the in-circuit digital tester 1. The present invention takes advantage of the fact that each test pin in the bed of nails 24 has an associated pin memory for storing test signal generating data to produce any desired test signal for each test pin in the bed of nails.

Included in the test head controller 14 is a functional tester 16 that performs any one of several preselected tests on the signal appearing on the response signal line 17. Included in the driver/receiver boards 20, 22 is a selection means for selecting the signal on one of the electrical nodes of the circuit under test as the signal to be applied to the response signal line 17. The functional tester 16 will perform its functional test on the response line 17 when the enable signal LISTEN* is at a logic zero. LISTEN* is generated by the programmable sequence controller 18 (see discussion below, and FIG. 5) and is applied to the test head controller 14. Internal to the test head controller 14 is a similar LISTEN signal that is combined with the LISTEN* signal generated from the controller 18 to enable the functional tester 16 to "listen" to the signal on response line 17. If the in-circuit tester operates in the control/data mode, the programmable sequence controller 18 will generate a HALT* command to the test head controller 14 when the test cycle is over. In other words, the test head controller 14 will generate a test cycle in its normal manner with the signal HALT* terminating the test cycle when the predetermined sequence of protocol control and data bus test signals have been generated.

Still referring to FIG. 1, supervising the generation of the test cycle and selecting the various digital test signals to be generated during the test cycle is central processing unit (CPU) 10. CPU 10 communicates with the test head controller 14 and programmable sequence controller 18 via the I/O interface 12. Prior to the start of a test cycle, the CPU 10 will transmit to the programmable pin memories located on the driver/receiver boards 20, 22 the necessary digital test signal generating data that will be required during the test cycle. Additionally, test cycle information, such as the length of the test cycle, the particular functional test to be performed by the functional tester 16, the clocking signal frequency MCKL, and other data is provided to the test head controller 14. If the test cycle is to be run in the control/data mode, the necessary information to select control and data sequences, and to generate these sequences is forwarded to the programmable sequence controller 18 and the driver/receiver boards 22.

Upon command from the CPU 10, the test cycle will be generated during which digital test signals will stimulate preselected inputs of the DUT 26 to thereby produce a response on response line 17. At the completion of the test cycle, the results of the functional tester 16 is transmitted via the I/O interface 12 to the CPU 10 for further processing. To produce the Gray code test signals in driver/receiver boards 20, 22, a set of Gray code memory addresses are generated by the test head controller 14. These Gray code memory addresses are applied to both driver/receiver boards 20 and 22.

To produce control/data test signals during a test cycle, a set of control/data memory addresses are produced by the programmable sequence controller 18, but these addresses are applied only to the driver/receiver boards 22. Appropriate address selection circuits are provided on driver/receiver boards 22 to select between the pin memory addresses from either test head controller 14 or programmable sequence controller 18. The selected addresses are used to output from the programmable pin memories the pre-programmed digital test-signal generating data stored therein.

The Protocol Control Sequence/Data Sequence Concept

Turning now to FIGS. 7 and 8 and first to FIG. 7, a block diagram for a microprocessor chip, such as that manufactured by Intel Corporation as its Model 8085 microprocessor, is shown. Various input and output signal points with node numbers are shown for the microprocessor. To the external world of the microprocessor chip as viewed from the signals appearing on input and output signal points, the internal cycle operations of the microprocessor will appear as those shown in the timing diagram of FIG. 8. FIG. 8 illustrates the digital signals that appear on several of the input/output pins of the microprocessor chip when the microprocessor is performing its normal functions. For example, four different cycles are illustrated in FIG. 8. For example, a memory fetch cycle is shown in which the microprocessor "fetches" from memory the contents of a particular main memory location.

In order to accomplish a fetch operation, the microprocessor must first output an address onto the address bus A0–A15 during the initial portion of the fetch cycle. That address would normally be received by the main memory unit bused to the microprocessor. The function of main memory is to store the program instructions and data for the microprocessor. At the proper time in the fetch cycle, the data contained in the specified memory location should then appear on the data bus portion of the address bus A0–A7 as input signals to the microprocessor. When the RD* (read command) transitions to the logic high state, the data currently on the address-/data bus lines A0–A7 are strobed into the microprocessor, thus completing the fetch cycle.

Also illustrated in FIG. 8 is a read and a write cycle for the microprocessor. For the read cycle, the microprocessor outputs an address onto the address bus A0–A15, once again to specify a memory location in the main memory from which the data is to be read. At the appropriate time in the read cycle, the data contained in the specified memory location will be available on the data bus portion of the address bus, A0–A7, and will be strobed into the microprocessor by the RD* signal. During the write cycle, the microprocessor first outputs onto the address bus lines A0–A17 the address of the memory location into which data is to be written. The control signal ALE is used by the device containing the addressed location to accept the memory address.

Following the memory address into which the data is to be written, the microprocessor outputs the data to be stored onto the data bus lines A0–A7 of the address bus. At the appropriate time in the write cycle, the WR* (write command) signal will be generated to cause the main memory unit containing the specified address to strobe the data appearing on the address/data bus A0–A7 into the addressed location. Finally, a reset cycle is shown in which a RESET IN* is generated to the microprocessor to initialize the internal circuits of the microprocessor. In testing a microprocessor device, normally the first operation simulated for the device is a reset cycle.

In order to exercise the microprocessor 8085 "in-circuit", it is necessary that digital test signals are generated as shown in FIG. 8 when any one of the four illustrated cycles are required. The particular microprocessor being tested and its particular instruction set will dictate which, and in what order, the various cycles of the processor must be generated in order to test the various capabilities of the device, or to use the operations of the microprocessor to test devices associated therewith. The programmable sequence generator of the present invention has divided the various test signals needed to test a bus oriented device, such as a microprocessor, into two categories—protocol control signals (hereinafter control sequence) and protocol data bus signals (hereinafter data sequences).

Still referring to FIG. 8, each of the four microprocessor cycles illustrated, the fetch cycle, the read cycle, the reset cycle and the write cycle are examples of control sequences. The signals appearing on address bus signal lines A0–A15 (lines A0–A7 comprise the address/data bus) are the data signals, all other input/output signals comprise control signals. A data sequence would, for example, comprise the sequence of data bus signals which would be generated to simulate a particular instruction operation of the microprocessor. These instruction operations involve at least one control sequence, but usually involve several.

To perform selected protocol sequences, not every one of the control signals need be generated. For example, the protocol signals X1, X2, READY and RESET* comprise all of the control signals which must be generated by the tester 1 during each of the control sequences illustrated in FIG. 8.

By defining the particular timing sequence of each of the control signals required by the microprocessor during each control sequence and by programming into the programmable pin memory units (see Data 52 and Control Memory 54 of FIG. 2) each sequence, it is then possible to recursively generate any operation cycle of the microprocessor by simply specifying a starting and a last address for the programmable pin memories. In other words, by sequentially generating a sequence of starting and last memory addresses any desired sequence in control sequences may be generated. For example, a fetch cycle followed by four read cycles could be generated by specifying the starting address for the fetch cycle followed by four consecutive occurrences of the starting address for the read cycle. In a similar manner, a plurality of different data signal sequence can be generated where a data sequence represents the data signals needed by the microprocessor to simulate an instruction operation and may involve several cycle operations or control sequences.

In effect, the test signal generating data stored in the programmable pin memories function very much like a series of computer program subroutines which are called up in any order by the programmable sequence controller 18. An example of the use of the programmable sequence generator 18 and control and data sequences of the present invention to execute a test of a microprocessor board, including the microprocessor illustrated in FIG. 7, is given in the section below entitled "A Sample Test Program".

The Programmable Sequence Generator

The Control/Data Driver/Receiver Boards 22

A more complete understanding of the protocol control and data sequence operation of the present invention may now be obtained by referring now to FIG. 2 which illustrates a more detailed functional block diagram of the programmable sequence controller 18 and a driver/receiver board 22. Each driver/receiver board 22 is capable of generating eight data bus signals and eight protocol control signals. As previously mentioned, each driver/receiver board 22 is capable of functioning both in the Gray code mode as well as the control/data mode for generating digital test signals for the 16 test pins associated with each driver/receiver board.

In the control/data mode, eight of the test pins will receive data signals from the data memory 52, while the remaining eight test pins will receive protocol control test signals from the protocol memory 54. Connected to both the data memory 52 and the protocol memory 54 is an associated drive means 56 which converts the digital test signal generating data from its respective memory into the logic levels of a test signal. These test signals are applied to the DUT through a selectable D relay connected to each test pin. Also connected to each test pin are three additional selectable switches, the E, F and G switches. The E, F and G switches for each pin are respectively bused together to form three buses, the E bus, the F bus and the G bus. The E, F and G switches for each pin for every driver/receiver board 20, 22 are connected to these three buses. The F bus functions as the response signal line 17. While a multiplexing arrangement involving three selectable switches for connecting each test pin to one of three buses is disclosed, it will be obvious to one skilled in the art that rather than providing one functional tester and multiplex a single response signal to a single bus that each test signal generator on each driver/receiver board could have its own functional tester associated therewith so that multiplexing at the pins would not be necessary. Additionally, fewer programmable test signal generators could be provided than test pins in the bed of nails fixture 24, with multiplexing of the generators between test pins.

To generate a test signal on the output of the driver means 56, an address is supplied to both the data memory 52 and to the protocol memory 54. Both the data and protocol memories output two bits of digital signal generating data for each addressed location to produce one digital test signal for each test pin associated with the particular driver/receiver board (see FIG. 3(b)), regardless of which mode of operation is used. For the preferred embodiment of the present invention, both data memory 52 and control memory 54 have 1,024 memory locations, with each addressed memory location having 16 bits of digital information stored therein, 2 bits for 8 test signals.

Figure 11:
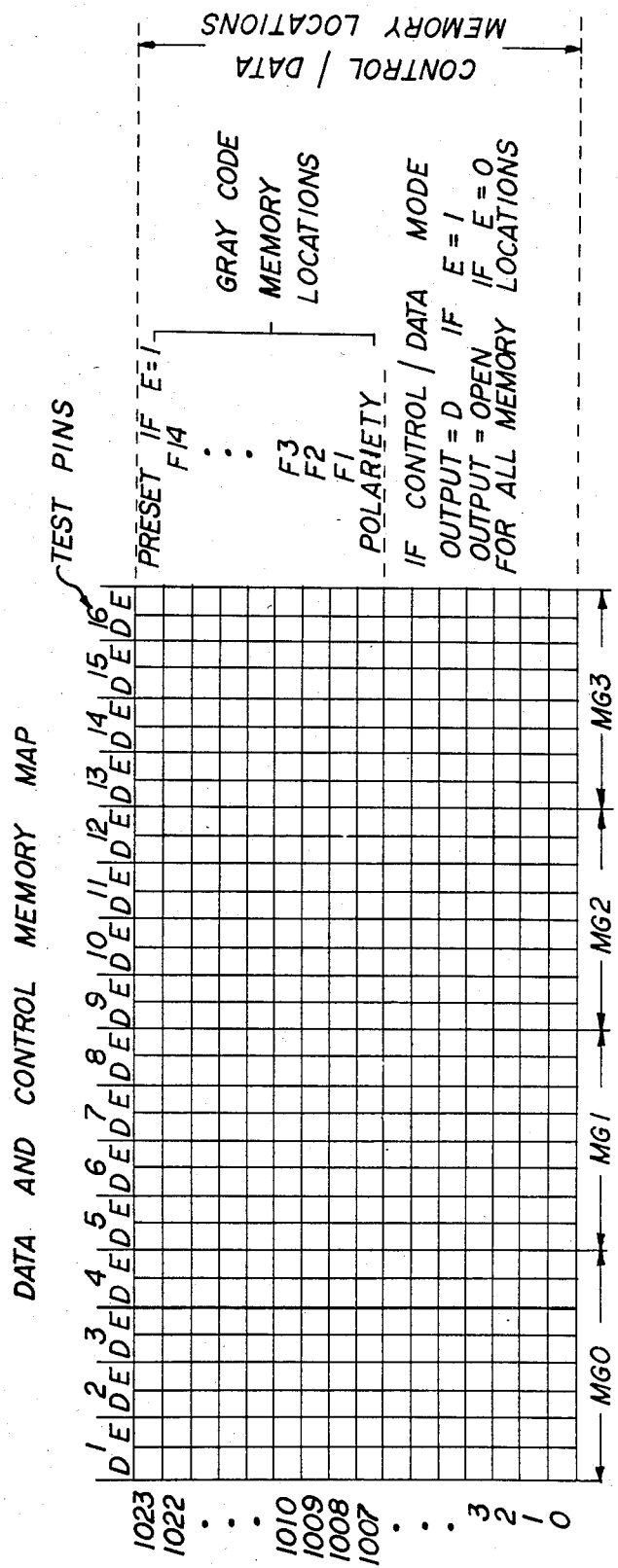
FIG. 11 is a pin memory map of the data and protocol memory units illustrated in FIG. 2.

To address 1,024 memory locations, a 10-bit binary address is required. For both the driver/receiver boards 20, 22, when operating in the Gray code mode, only 16 memory locations are used in data memory 52 and protocol memory 54 to store the Gray code test signal generating data. For an illustration of the memory programming of the control and data memories, reference can be had to FIG. 11 which shows the data and control memory map. Address locations 1023-1007 are identified as the Gray code memory locations. When operating in the control/data mode, all of the data and control memory addresses are available for storing the test signal generating data for both the data test signals and the control test signals.

As shown in FIG. 1, it is the test head controller 14 that produces the Gray code memory addresses. These addresses are applied to both types of driver/receiver boards 20, 22. As shown in FIG. 2, the 4-bit Gray code memory addresses are applied to multiplex units 48 and 50, along with the four low order bits of the 10-bit control memory addresses outputted by the programmable sequence controller 18. When the driver/receiver boards 22 are to be operated in the control/data mode, the signal GRY-PSG-will be in the appropriate logic state to enable the 2-1 multiplexers 48, 50 to apply the four low order bits of the data addresses to the four low order address inputs of data memory 52, and the four low order bits of the control memory addresses to the four low order address inputs of the control memory 54. The remaining six higher order address bits for both the data and control memory addresses are applied through tri-state buffers (not shown) to the data memory 52 and the control memory 54, respectively. When operating in the Gray code mode, these higher order address bits are held at a logic high.

Accordingly, the 16 memory locations used to store the Gray code signal generating data become the last 16 memory locations (locations 1023-1007). The data memory addresses and the control memory addresses are generated by controller 18 in a predetermined sequence to output digital signal generating data to the associated driver means 56 to produce the desired data bus signals and protocol control signals required to test the device under test.

Turning now to FIG. 3(a) for a more detailed circuit diagram of the data memory 52 shown in FIG. 2, a portion of data memory 52 is shown comprised of two memory units, data memory 58 and data enable memory 60. Each memory unit 58, 60 is a 1,024×4 bit memory unit. As was previously mentioned, two bits of digital information are required by the driver means 56 in order to generate a single digital test signal. These two bits of information are referred to as the data bit and the data enable bit.

FIG. 3(b) is a memory map for a memory unit having n memory locations with two bits of digital information in each memory location. The address for each memory location is illustrated above the memory with the data (D) bit shown opposite the data enable (E) bit. The memory unit illustrated in FIG. 3(b) is illustrative of how the digital information from memory units 58 and 60 are combined to generate a digital test signal for test pin 1. That is, the data bit appears on line 82 and the data enable bit appears on line 84.

The preferred embodiment of the present invention has constructed data memory 52 and protocol memory 54 from memory chips having a 1,024×4 bit arrangement. Accordingly, the memory units 58, 60 illustrated in FIG. 3(a) are capable of producing only 4 data bus test signals while each driver/receiver board 22 is capable of producing a total of 8. The circuit arrangement, as illustrated in FIG. 3(a), is duplicated once to produce the remaining 4 data signals. It would be obvious to a person of ordinary skill in the art having the teachings of the disclosure herein, that a different memory device having a different number of memory locations and a different number of bits per memory location to construct the present invention could be chosen. For example, four 2-bit 1,024×2 bit memory units could be selected to duplicate the signal generating capacity of memory units 58, 60.

Still referring to FIG. 3(a), the respective digital signal generating data that is stored in data memory 58 and in data enable memory 60 are each applied to identical logic circuits comprised of AND/OR select gates 62 and quad latches 64. These two devices 62, 64 are connected in series, with the output from the quad latch 64 fed back as the B input to the AND/OR logic gates 62. The A inputs to gates 62 are the 4 bits from either the data memory 58 or the data enable memory 60. The function of logic gates 62 and latch 64 is as follows: First, when the driver/receiver board 22 is functioning in the Gray code mode, the logic level on line 83 is caused to change logic states each time that a logic 1 appears on the line 82 out of data memory 58 since the Gray code mode of operation requires that the generated digital output test signal change state each time that a logic 1 is read from the data memory 58.

When the driver/receiver board 22 is to be operated in the control/data mode, the logic level that is generated on signal line 83 is intended to follow the logic level that is present on signal line 82 out of data memory 58. In other words, the logic level outputted by data memory 58 specifies the logic level that is produced on the output of driver amplifier 55, rather than specifying a transition in that digital signal as is the case in the Gray code mode. For both the Gray code and control/data modes, when a logic 1 appears on signal line 85, the logic level on signal line 83 is enabled to pass through driver amplifier 55 and appear on line 87. As shown in FIG. 3(a), the signal on D line 87 is applied to the selectable relay associated with test pin 1. The data enable data stored in memory 60 is then selected, depending on the mode of operation, to generate a logic 1 on the output from its associated latch 65 when an output logic level is to be generated for that test signal.

Sequence controller 18 produces a further enable signal, DATA ENABLE, that is applied to each logic gate 62. DATA ENABLE, when true, disables the combination of gates 62 and latches 64 from producing any logic signals out of its associated driver means 56. With this feature, it is possible, for example, to remove all the data bus test signals from the address/data bus lines of the device under test when the device under test itself is generating logic levels on these lines.

The selection of the mode of operation for the logic gates 62 is specified by the logic level of the signal GRY-P, while the clock signal for quad latches 64 and 65 are supplied on the DSYNC and ESYNC signals respectively. For the presently preferred embodiment of the invention, the logic gates 62 are manufactured and sold by Monolithic Memories, Inc. as their PAL 14H4. This device is a programmable device equivalent to a 512×4 bit ROM. The programming of this device is provided as an Appendix B at the end of this description. While the function of providing a digital test signal generator with logic level transitions occurring on logic 1 in the Gray code mode, or as the output logic state when in the control/data mode is disclosed with respect to PAL 14H4 programmed ROMs, other programmed arrays could be used, in addition to the use of hybrid circuits to increase D/R board density.

The memory arrangement discussed with respect to the data memories, 52 in FIG. 3(a), is identical to that for protocol control memory 54 (FIG. 2), except that there is no enable signal generated by the controller 18 to disable the generation of the control signals from the driver means 56 associated with the control memory 54.

Also shown in FIG. 3(a) is a detailed circuit diagram for a driver amplifier 80 which forms a part of the drive means 56. Each test signal generator has a drive amplifier 80 associated therewith for generating the logic drive signals for a node of the circuit under test. The operations of the transistor switches Q1, Q2, Q3 and Q4 are well known and obvious to a person of ordinary skill in the art, and a detailed explanation will not be provided. However, one point should be made. When the data enable bit on line 85 is true, driver amplifier 80 will output on signal line 87 the logic state that is appearing on signal line 83, i.e., if line 83 is a logic 1, line 87 will be at a logic level corresponding to the DUT 26 Vcc voltage level, and if at a logic zero, line 87 will also be at a logic zero. On the other hand, if the data enable bit on line 85 is false, neither tri-state buffer 70 nor 2-input AND gate 68 will produce an output in response to the logic signal on line 83. As a result, transistors Q2 and Q4 will be non-conducting and the signal on line 87 will represent an open circuit drive to the DUT.

The Programmable Sequence Controller 18

Turning now to FIG. 2, a more detailed block diagram of the programmable sequence controller 18 is shown. The programmable sequence controller 18 consists of a programmed sequence control means 28 which outputs, among other things, the starting addresses for both the control and data sequences used in the testing of the microprocessor board. The sequence controller 18 includes two portions, one for generating the predetermined sequences in the control memory addresses which generate the protocol control sequences, and a data sequence portion for generating the predetermined sequences of data memory addresses for the data sequences.

The control sequence portion of controller 18 consists of a buffer memory unit labeled control FIFO 40 which responds to the data output from control means 28, a control address counter 44 connected to the output of the control FIFO 40, a protocol sequence length memory 38 which responds to the addresses from control address counter 44 and a control synchronization means 42 which responds to the output from the protocol sequence length memory 38.

In operation, control FIFO 40 functions to buffer the starting addresses of the control sequences to be generated from the control means 28 to the control address counter 44. Since the execution rate of the control means 28 is much greater than the rate at which the control sequences will be generated, the control FIFO 40 provides the means for a steady and uninterrupted sequence of starting addresses for the protocol control sequences to be available as needed. Control synchronization means 42 operates to load a starting address from the control FIFO 40 into the control address counter 44 at the appropriate time. Control FIFO 40 generates the signal CP READY to the control means 28 when the control FIFO 40 buffer memory is not full. In this way, the control means 28 can continue to load starting addresses into the control FIFO 40 when memory locations are available.

When a starting address for a protocol control sequence has been loaded into the control address counter 44, a clocking of the counter can occur to sequentially step through the next consecutive control memory addresses. Responding to the addresses from the control address counter 44 is the protocol sequence length memory 38. Several control signals are stored in each address memory location in memory 38. For example, the control signal LAST ADDRESS which indicates if the current control memory address from control address counter 44 is the last address in the control sequence currently being generated. If so, the control synchronization means 42, which is responding to the control signals stored within the protocol sequence length memory 38, generates control signals to the control FIFO 40 to bring forth the next starting address for the next control sequence, and then generates the necessary strobe signal to load that address into the control address counter 44.

Another control signal stored within the protocol sequence length memory 38 is the signal DATA ADVANCE. DATA ADVANCE is used to enable the data sequence address counter 36 to clock to the next address in the sequence of predetermined addresses for a selected data sequence. A further description of the function of the signal DATA ADVANCE is given below.

Also outputted from the protocol sequence length memory 38 is the signal DATA ENABLE which, as previously mentioned, is applied to the driver means 56 associated with the data memories on the control/data driver/receiver boards 22. The function of DATA ENABLE is to enable the driver means 56 associated with the data memory 52 to further enable the generation of the data test signals according to the data stored in the data memory 52. Unlike the driver means 56 associated with the data memory 52, the driver means 56 associated with the protocol memory 54 does not receive an enabling signal from the protocol sequence length memory 38 to inhibit the generation of protocol control signals during a test cycle.

Primarily, the function of DATA ENABLE is to insure that the driver amplifiers, such as amplifiers 80, are generating open circuit signals on their outputs during the time the data bus lines to which they are attached contain signals generated by other devices. Data buses can sometimes serve dual purposes, sometimes carrying addresses and sometimes carrying data. When the driver/receiver boards 22 are to produce digital test signals for the data bus signal lines, the associated driver means 56 will be enabled by DATA ENABLE. However, when there are to be signals on the data bus lines that are not generated by the driver/receiver boards 22, the DATA ENABLE will disable driver means 56 to produce the open circuits on the output of the driver amplifiers 80.

The data sequence portion of controller 18 operates in a similar manner to the control sequence portion. A buffer memory labeled data FIFO 41 is provided for buffering the starting addresses of the data sequences to be generated from the control means 28 to the data sequence address counter 36. As before, data FIFO 41 functions to provide a continuous uninterrupted sequence of starting addresses where the clocking rate of the data sequences is much lower than the execution rate of the control means 28.

Responsive to the addresses generated by the data sequence address counter 36 is a data sequence length memory 39. Stored within data sequence length memory 39 is a signal corresponding to the last address of a data sequence, DATA LAST ADDRESS. DATA LAST ADDRESS is outputted when the last address for a data sequence is being generated from the data sequence address counter 36, and is applied to the data synchronization means 37. Synchronization means 37 reponds to DATA LAST ADDRESS to cause data FIFO 41 to bring forth the next starting address for the next data sequence for loading into the data address counter 36. At the appropriate time, data synchronization means 37 produces a load pulse to the data sequence counter 36 to load the starting address for the next data sequence.

The data sequence address counter 36 is also connected to the output of the control synchronization means 42. As previously discussed, the signal DATA ADVANCE is outputted by the protocol sequence length memory 38 to provide an enabling signal to the data sequence address counter 36 to enable the data address counter 36 to increment to the next address, or to increment addresses as long as DATA ADVANCE is true.

The significance of the DATA ADVANCE feature in relation to the generation of the control memory addresses will be better appreciated with reference to the more detailed discussion of the operation of the present invention given in the discussion of the sample test program below.

Figure 4:
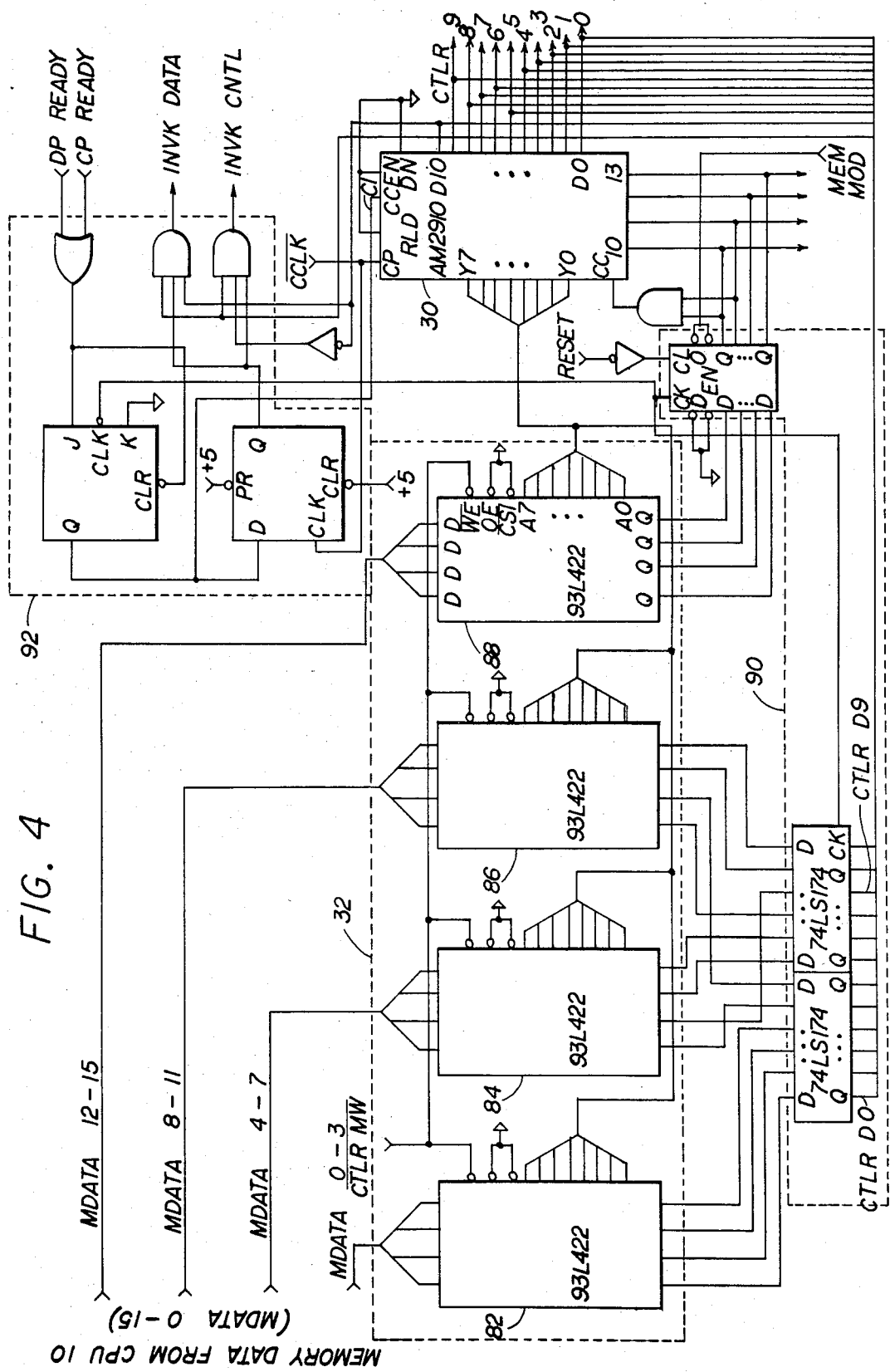
FIG. 4 is a block diagram of the control means illustrated in FIG. 2.

Controlling the generation of the various protocol control and data sequences during a test cycle is the control means 28. FIG. 4 is a more detailed circuit diagram of the control means 28 shown in FIG. 2. Referring now to FIG. 4, a bit-slice processor 30 is shown in operation with a plurality of random access memory units 82, 84, 86 and 88, forming the main memory 32 for the processor 30. Memory 32 stores, among other things, the starting addresses for both the control and data sequences to be generated during the test cycle.

Connected between the data output from the memory 32 and the data input of the processor 30 is a latch 90 which provides temporary storage for the entire clock cycle of the processor 30 of the instruction field to come from the main memory 32. This permits the processor to construct the next address for the next instruction field as soon as the previous instruction has been loaded into latch 90. In this manner, the data for the next instruction will be available at the input of latch 90 at the start of the next clock cycle.

As previously mentioned, both the data FIFO 41 and the control FIFO 40 generate signals to the control means 18. These signals are labeled DP READY and CP READY and indicate that the data buffer and control buffers, respectively, are not full. When either of these two signals are true, the processor 30 will continue execution to output starting addresses to the buffers.

To direct into which buffer memory a sequence starting address is to be loaded, the signals INVK DATA and INVK CNTL are generated to the data FIFO 41 and the control FIFO 40, respectively. INVK DATA is generated when a starting address outputted by control means 18 is for a data sequence and INVK CNTL when it is for a control sequence.

As previously mentioned, the instruction execution speed of the processor 30 is much greater than the rate at which the control address counter 44 or the data sequence counter 36 generate their respective predetermined sequences of memory addresses so sometimes processor 30 will be idle or in a looping condition. Thus, when the FIFO memories 40, 41 are full, further cycling of the processor 30 will be halted.

At the completion of the stored program in memory 32 of controller 18, the processor 30 will automatically go to a looping state where no further starting addresses will be outputted to the FIFO memories. While in the looping mode, the contents of the FIFO memories will continue to be unloaded in response to the completion of each control and data sequence. When the FIFOs become empty, the synchronization means 42 will not produce a load pulse to the control address counter 44, but instead, will generate a HALT signal which is inputted to the test head controller 14. The HALT signal terminates the generation of the current test cycle.

For the presently preferred embodiment of the invention, processor 30 is an Advance Micro Device Model No. Am2910 microcomputer. Information concerning the Am2910 may be found in the publication entitled "The Am2900 Family Data Book with Related Support Circuits," publication No. AM-PB003, copyrighted 1979 by Advance Micro Devices.

The Control Sequence Portion of Controller 18

Figure 5:
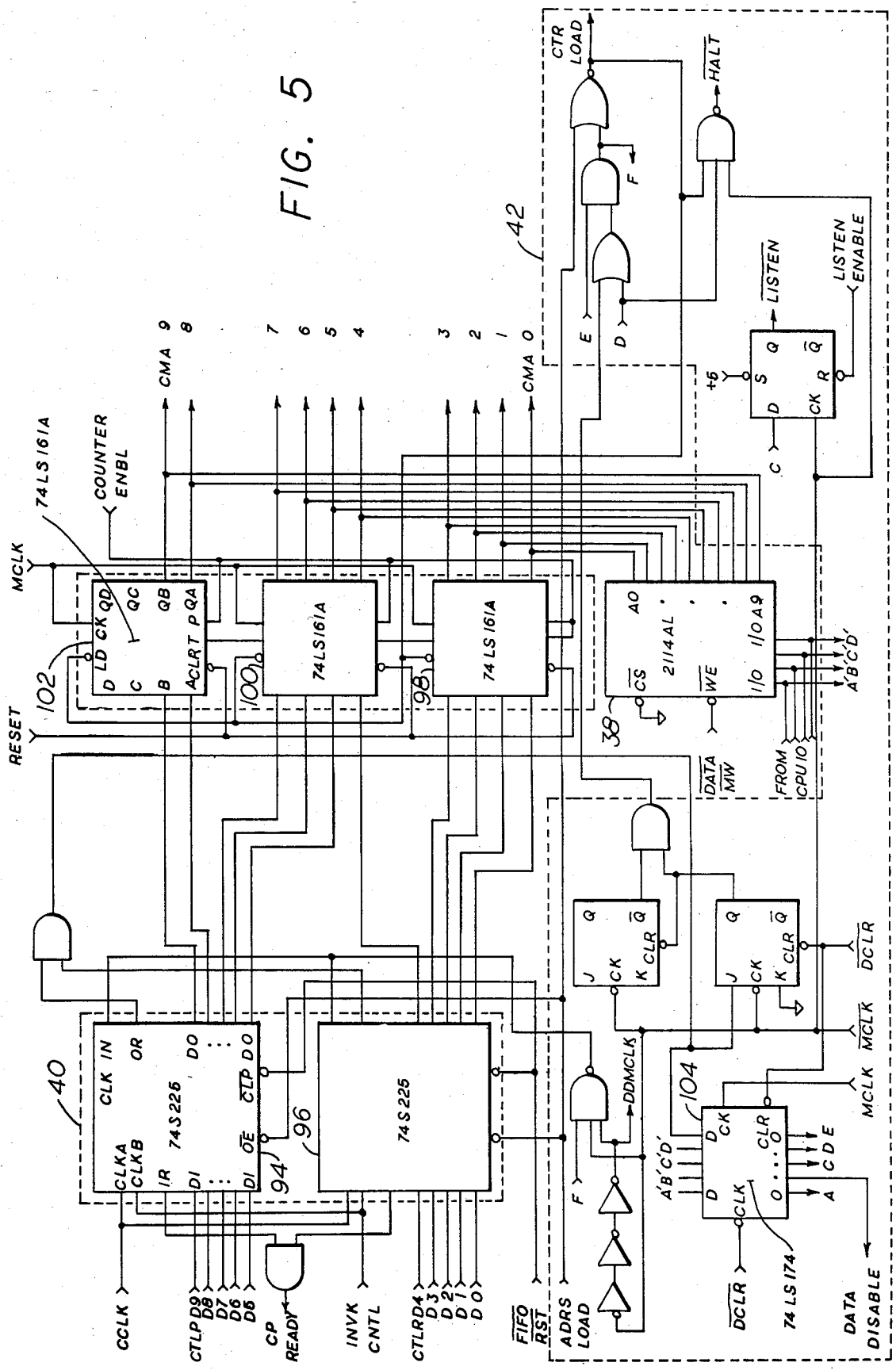
FIG. 5 is a more detailed circuit diagram of the protocol control sequence generation circuits shown in FIG. 2.

A more detailed circuit diagram for the control sequence portion of controller 18 is illustrated in FIG. 5. Referring now to FIG. 5, control FIFO 40 is shown comprised of two 5-bit buffer memory units 94, 96 which together comprise a 10-bit memory for storing the starting address for the control sequences. The output from processor 30, CTLR D0-D9, are inputted to the FIFO 40 data inputs DI. The protocol sequence length memory 38 responds to the address outputs of the control address counter 44 to output four control signals, LAST ADDRESS, DATA ADVANCE, LISTEN and DATA ENABLE. Address counter 44 is comprised of 4-bit counters 98, 100, 102.

The output from the protocol sequence length memory 38 is strobed into a temporary holding latch 104 contained in the control synchronization means 42 for use during the current clock cycle of MCLK. The output from latch 104 is applied to various logic elements to produce different control signals, such as CTR LOAD* which loads the control address counter 44 with a starting address from control FIFO 40. As long as there is a starting address contained in the control FIFO 40 for a control sequence, each time a LAST ADDRESS is outputted by the protocol sequence length memory 38, the signal CTR LOAD* will be generated to update the control address counter 44. However, if the last control sequence has been generated, the signal DD HALT* will be generated rather than CTR LOAD* at the end of the last control sequence to terminate the current test cycle.

Also outputted by the protocol sequence length memory 38 is the signal LISTEN ENABLE which is applied to the functional tester 16 of the test head controller 14. The signal LISTEN ENABLE determines when the functional tester will perform tests on the signal on the response signal line 17 during a test cycle.

The Data Sequence Portion of Controller 18

Figure 6:
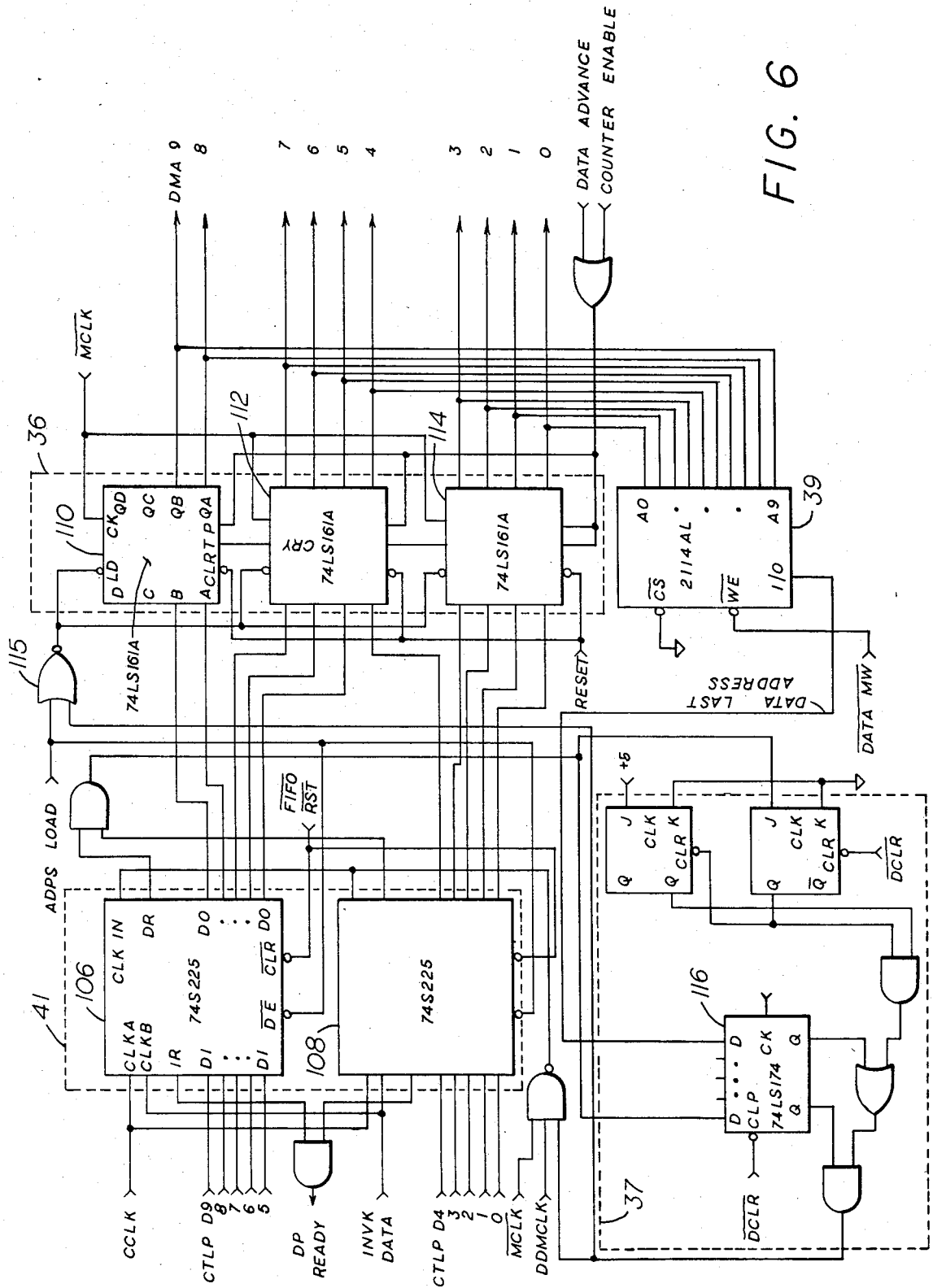
FIG. 6 is a more detailed circuit diagram of the data sequence generation circuits shown in FIG. 2.

A more detailed circuit diagram for the data sequence portion of controller 18 is shown in FIG. 6. Referring now to FIG. 6, the data FIFO 41 is shown comprised of two 5-bit buffer memories 106, 108 which together forms the 10-bit data FIFO 41 for storing the starting addresses of the data sequences to be generated. The output from data FIFO 41 is applied as the data input to the data address counter 36. Address counter 36 is comprised of three 4-bit binary counters 110, 112, 114 to form a 10-bit data address counter.

The address output from the data address counter 36 is applied as the address input to data sequence length memory 39. The output from data sequence length memory 39, DATA LAST ADDRESS, is applied to latch 116 for temporary storage. If the logic level for DATA LAST ADDRESS indicates that the last address in the current data sequence is occurring, the data synchronization means 37 generates a load command on the output of NOR gate 115 to the data address counter 36 at the next occurrence for the signal ADRS LOAD. This load command loads the starting address for the next data sequence into counters 110, 112, 114.

A Sample Test Program

The present invention may be understood best by reference to an example test program for testing a bus oriented device, such as a random access memory RAM associated with an Intel 8085 microprocessor as its controller. The following TABLE 1 is an example program written in the language of an 8085 microprocessor to create a checker board pattern in the RAM, and then verifying what was stored.

In order to load the checker board pattern into the RAM chip, the 8085 is used as the controller which will write and read from the RAM memory certain data which will alternate each bit location in each memory location in any direction, i.e., a checker board pattern. In other words, the 8085 will be programmed in a specific manner to achieve a desired test operation.

TABLE 1

8085 TEST STEPS

| ADRS | DATA | INSTRUCTION | CYCLE |
|------|------|-------------|-------|
| 0000 | 2A | LHLD | F |
| 0001 | FF | | R |
| 0002 | FE | | R |
| FEFF | 00 | | R |
| FF00 | 18 | | R |
| 0003 | 3E | MVI A | F |
| 0004 | AA | | R |
| 0005 | 77 | MOV M,A | F |
| 1800 | AA | | W |
| 0006 | 2F | CMA | F |
| 0007 | 23 | INX H | LF |
| 0008 | 77 | MOV M,A | F |
| 1801 | 55 | | W |
| 0009 | 2F | CMA | F |
| 000A | 23 | INX H | LF |
| . | | | |
| . | | | |
| . | | | |
| 0182 | 77 | MOV M,A | F |
| 18EF | 55 | | W |
| 0183 | 2F | CMA | F |
| 0184 | 23 | INX H | LF |
| 0185 | 2A | LHLD | F |
| 0186 | FF | | R |
| 0187 | FE | | R |
| FEFF | 00 | | R |
| FF00 | 18 | | R |
| 0188 | 7E | MOV A,M | F |
| 1800 | AA | | R WO/DRIVE |
| 0189 | 23 | INX H | LF |
| 018A | 7E | MOV A,M | F |
| 1801 | 55 | | R WO/DRIVE |
| 018B | 23 | INX H | F |
| . | | | |
| . | | | |
| . | | | |
| 0286 | 7E | MOV A,M | F |
| 18EF | 55 | | R WO/DRIVE |
| 0287 | 23 | INX H | LF |
| HALT | | | |

The column ADRS illustrated in TABLE 1 represents the address in hexadecimal notation that would appear on the address lines A0–A15 of the 8085 microprocessor when an address was supposed to be on the bus for a given operation cycle (see FIG. 8). Similarly, the column DATA represents the data on address lines A0–A7 when data is supposed to appear in a given operation cycle. The column INSTRUCTION represents the assembler language instruction of the 8085 which is being simulated. Finally, the rightmost column CYCLE indicates what operation cycle for the 8085 is being executed for the given ADRS and DATA fields. For example, the designation F refers to a "fetch" operation cycle while "R" for read, W for "write," and so forth.

The test program can generally be described as comprising the following steps. First, the memory pointer register HL is loaded with the contents of address FEFF given in hexadecimal notation. This function is performed by execution of the instruction LHLD. For this instruction, the contents of the next two consecutive memory locations contains the address of the location containing the data. Since the present invention is simulating the programming, the address outputted by the 8085 is not used and the data FEFF is simply supplied to the 8085 as though it were being read from memory.

Having obtained the address FEFF, the 8085 now outputs this address during a read operation cycle. At the appropriate time in the read cycle, the present invention presents the data 00 to the 8085 as one-half of the data word which is theoretically stored in address FEFF. Since two memory words make up a single microprocessor data word, the contents of the next location is also read, FFOO. The address location FFOO contains an 18. The data word 1800 is the starting address for the RAM chip to be tested. Next, a move instruction to move immediate data contained in the next adjacent memory location to the A register is executed. The results of these first two instructions is to set up the memory address pointer HL with the starting address (1800) for the RAM chip and to load the A register with the data (AA) to be stored starting at that address. Next, a repeating loop from address 0005 to 0184 is then carried out 128 times in which alternate memory locations are loaded with either the contents of the A register (AA) or the complement (CMA) of the contents of the A register (55). These instructions create the checker board pattern in the RAM chip which contains 128 memory locations. It should be appreciated that not all of the entries listed under column DATA in TABLE 1 are generated by the present invention. For example, the data 55 for address 1801 is outputted by the 8085 and not by the test signal generators connected to the data bus lines A0–A7.

After loading the checker board pattern, the contents of the memory pointer register is once again loaded with the starting address for the RAM chip and then a second repeating loop executed in which the contents of the chip are read out, location-by-location. Reading of the RAM chip occurs by executing the instructions MOV A,M followed by an incrementing of the memory pointer register INX H. These two instructions occur 128 times. By monitoring the signal patterns on any one of the signal points by the functional tester 16, it is possible to determine if the RAM chip functioned properly. For example, were the proper CRC signatures obtained on each signal line.

In accordance with the present invention, a program in the language of the testor 1 to simulate the programming of the microprocessor 8085 in accordance with the program given in TABLE 1 is given in TABLE 2 as follows:

TABLE 2

| | |
|---|---|
| INVOKE RESET | 'Performs a reset cycle for the 8085 |
| CALL LHLD [00,H18] | 'Load HL reg with ram adrs 1800 hex |
| CALL MVIA [HAA] | 'Load A reg with AA hex |
| REPEAT 128 TIMES | 'write alternating AA, 55 to 128 ram locations |
| CALL MOVMA | 'move A reg to memory |
| CALL CMA | 'compliment A reg |
| CALL INXH | 'increment HL (or ram adrs) |
| END REPEAT | |
| CALL LHLD [00,H18] | 'reinitialize HL |
| REPEAT 128 TIMES | 'read 128 ram locations |
| CALL MOVAM | 'move memory to A reg |
| CALL INXH | 'increment HL |
| END REPEAT | |
| HALT | |
| BUFFER ON | |
| DONE | |

Each of the basic microprocessor cycle operations, such as a fetch F or a read R cycle are indicated in the programming of the 8085 as the rightmost column. These control protocol sequences and the data sequences for generating the data signals which are presented in the column headed DATA of the 8085 test program have been encoded into the program generation software of the present invention. This software simulates a test program in the language of the tester 1 of the present invention to simulate the programming of an 8085 in its language through subroutines which include IN-VOKE instructions. Each INVOKE instruction causes the test signals for data or control sequences to be created. This data is eventually stored in the devices of the controller 18 and the driver/receiver boards 22 for execution at run time.

Listed in Appendix A of this specification are the control protocol sequences and data protocol sequences as well as the subroutines which would be typically written to carry out the instructions of the tester 1 test program given above in TABLE 2.

Figures 9, 10:
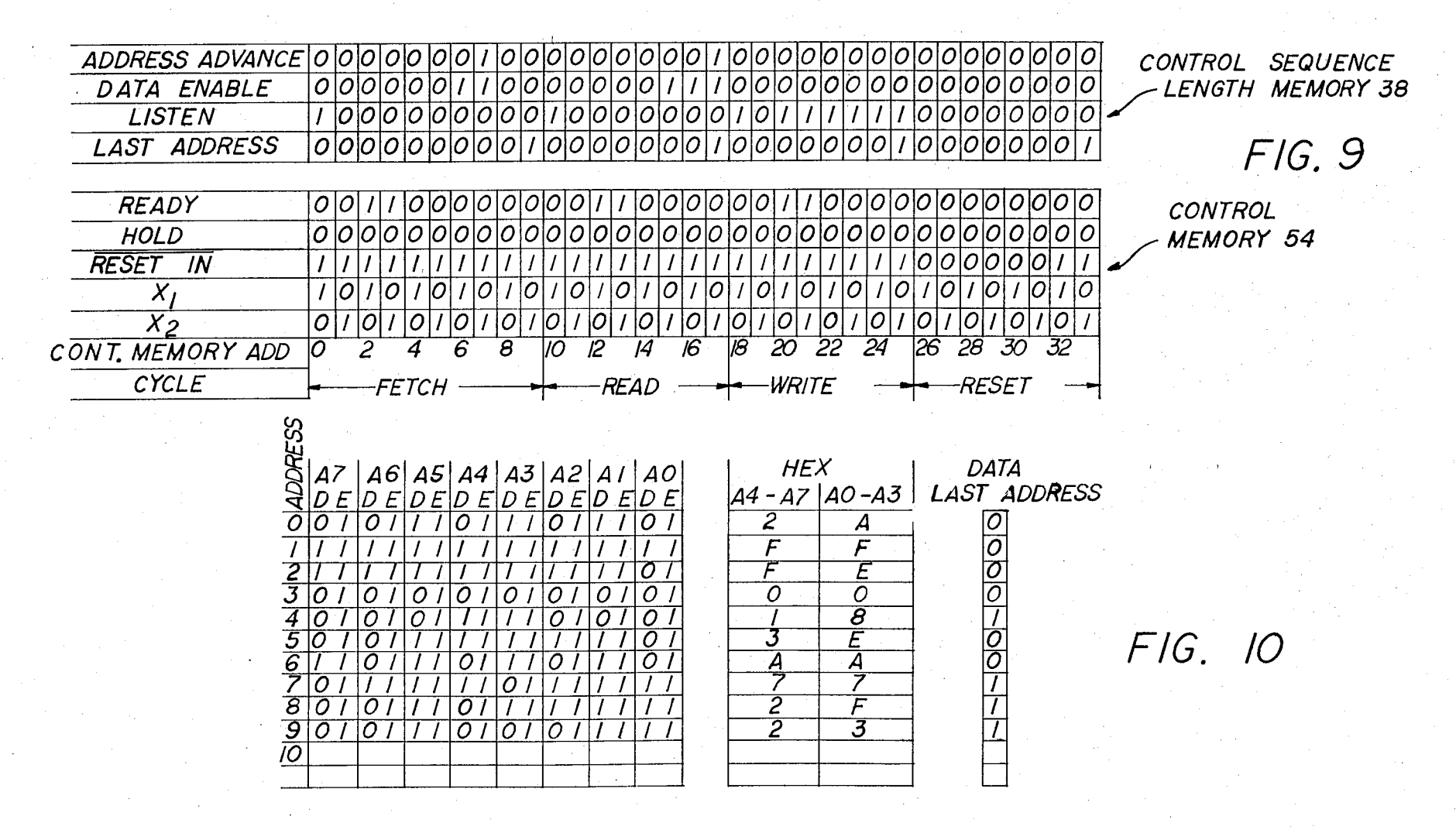

The information presented in the column DATA of the 8085 test program presented in TABLE 1 is in a hexadecimal notation and represents the data that would for the most part be stored in the data memory 52 (see FIG. 2). The programming for the control memory 54 to generate the control test signals for the 8085 microprocessor to perform the various cycle operations, such as fetch, read or write is shown in FIG. 9 along with the contents of the control sequence length memory 38. FIG. 10 shows the programming of the data memory 52 for the first portion of the 8085 test program as illustrated in TABLE 1. The programming for the control memory 54 implements the control signals for the four basic cycle operations, fetch, read, write and reset for the 8085 chip illustrated in FIGS. 7 and 8.

The operations of the present invention can be further illustrated by referring to the programming of the control memory 54 and data memory 52 illustrated in FIGS. 9 and 10, respectively, taken in conjunction with the test program illustrated in TABLE 1. Particularly, the first instruction LHLD to load the memory pointer register HL from the contents of the memory location identified by the hexadecimal address FEFF is specified by the contents of the data memory address 0, which is 2A. This 4-bit word represents the LHLD instruction and is input to the 8085 microprocessor by the present invention when a F (fetch) cycle is initiated. Thus, the starting address for the first protocol control sequence for this example will be address 0. This address is loaded into control memory address counter 44 at the start of testing. Since the data to be loaded into the memory pointer register follows in the next two consecutive memory locations following the load command, two consecutive read cycles must be executed for the 8085 microprocessor whereby the desired address FEFF will be constructed internal to the microprocessor chip. To execute a read cycle, the starting address 10 is loaded into the control memory address counter 44.

Now that the microprocessor has the address of the memory location containing the data to be moved to the memory pointing register HL, the 8085 microprocessor outputs the address FEFF onto the address data bus. The present invention now executes two consecutive read cycles to simulate the reading of the contents of the two consecutive memory locations FEFF and FF00 (FEFF+1). This data represents an address 1800, the starting address for the RAM chip, to be loaded into the memory pointing register HL. The data to construct this memory address is contained in the data memory 52 locations 3 and 4. Address 4 for the data memory 52 would then represent the last address in the data sequence. This last address is indicated by a logic 1 in the memory address location 4 of the data sequence length memory 39. This bit causes the data FIFO 41 to present the next starting address for the next data sequence to the data sequence address counter 36. In this case, the starting address would correspond to address 5 since the next data sequence would be to generate the data signals for the 8085 instruction MVI A which is the second instruction in the test program shown in TABLE 1.

For the first repeat loop, the three instructions MOV M,A; CMA and INX H will be repeated 128 times. Each of these three instructions require one address location in the data memory 52 to generate the data bus signals to simulate the instructions, the MOV M,A requiring only the address location 7 since the data AA which follows the 77 data will actually be outputted by the 8085 microprocessor rather than being generated by the data bus signal generator 52. Thus, the data sequence length memory 39 will contain a 1 in address 7 even though this is also the starting address for this data sequence. Thus, it can be seen that a data sequence is used to specify the sequence of data signals required to simulate an instruction in the assembly language of the microprocessor while the protocol control sequences are required to carry out the basic machine cycles which must occur in order for the given instruction to be executed.

Referring to FIG. 9, for each cycle, the fetch, the read and the write cycle, there is a point in their respective cycles at which data should be placed onto the address/data bus lines A0-A7. At those times, the protocol sequence length memory 38 will output for the DATA ENABLE signal a logic 1 when the driver amplifiers of driver means 56 are to produce digital data signals onto the data bus. Until the DATA ENABLE signal from protocol sequence length memory 38 goes true, driver means 56 associated with the data memory 52 will not generate any digital signals to the microprocessor.

As shown in FIG. 9, the contents of data memory 52 at address 0 (2A) is applied to the microprocessor data bus during a fetch cycle for two consecutive memory locations 6 and 7 of the control memory 54 corresponding to the fourth cycle of the microprocessor clock signals X1 and X2. DATA ENABLE is true during memory addresses 6 and 7 for the control memory 54. At control memory address 7, the protocol sequence length memory 38 outputs for the DATA ADVANCE signal a logic 1 permitting the data address counter 36 to increment to the next sequential address as long as the current address is not the last address in a data sequence.

In describing the invention, reference has been made to the preferred embodiment. However, those skilled in the art and familiar with the disclosure of the invention may recognize additions, deletions, substitutions or other modifications which would fall within the purview of the invention as defined in the appended claims.

APPENDIX A

```
/*DATA DIRECTOR FUNCTIONAL TEST
BEGIN
"8085 DD"
DISABLE
392,LH          244,LH
26,LL           RST 5.5
25,LL           RST 6.5
24,LL           RST 7.5
304,LL          HOLD
311,LL          READY
CONTROL PROTOCOL RESET (62)
NODE 28,6H,48L,8H               RESETIN*
```

APPENDIX A-continued

/*DATA DIRECTOR FUNCTIONAL TEST

```
NODE 72.H.L    'X1
NODE 73.L.H    'X2
LISTEN.L
DRIVE.L
ADVANCE.L
DONE
CONTROL PROTOCOL FETCH (16)
NODE 28.H                    'RESETIN*
NODE 72.H.L    'X1
NODE 73.L.H    'X2
LISTEN.L.H.6L
DRIVE.5L.6H.5L
ADVANCE.15L.H
DONE
CONTROL PROTOCOL LFETCH (24)
NODE 28.H                    'RESETIN*
NODE 72.H.L    'X1
NODE 73.L.H    'X2
LISTEN.L.H.7L.H.14L
DRIVE.5L.6H.13L
ADVANCE.23L.H
DONE
CONTROL PROTOCOL READ (12)
NODE 28.H                    'RESETIN*
NODE 72.H.L    'X1
NODE 73.L.H    'X2
LISTEN.L.H.4L
DRIVE.5L.5H.2L
ADVANCE.11L.H
DONE
CONTROL PROTOCOL WRITE (12)
NODE 28.H                    'RESETIN*
NODE 72.H.L    'X1
NODE 73.L.H    'X2
LISTEN.L.H.4L
DRIVE.L
ADVANCE.L
DONE
DATA PROTOCOL DLHLD [X,Y] HEX
   DEPOSIT 2A OFF OFE X Y
DONE
SUBR LHLD [X,Y]         'LOAD MEMORY POINT-
                         ER REGISTER HL
                         FROM ADRS FEFF Hex
   INVOKE DLHLD [X,Y]
   INVOKE FETCH
   REPEAT 4 TIMES
      INVOKE READ
   END REPEAT
DONE
DATA PROTOCOL DMVIA [X] HEX
   DEPOSIT 3E X
DONE
SUBR MVIA [X]           'MOVE IMMEDIATE DA-
                         TA [X] TO A REGISTER
   INVOKE DMVIA [X]
   INVOKE FETCH
   INVOKE READ
DONE
DATA PROTOCOL DMOVMA HEX
   DEPOSIT 77
DONE
SUBR MOVMA              'MOVE A REG TO MEM-
                         ORY AT HL POINTER
   INVOKE DMOVMA
   INVOKE FETCH
   INVOKE WRITE
DONE
DATA PROTOCOL DCMA HEX
   DEPOSIT 2F
DONE
SUBR CMA                'COMPLIMENT A REG
   INVOKE DCMA
   INVOKE FETCH
DONE
DATA PROTOCOL DINXH HEX
   DEPOSIT 23
DONE
SUBR INXH               'INCREMENT HL POINT-
                         ER REG
   INVOKE DINXH
```

APPENDIX A-continued

/*DATA DIRECTOR FUNCTIONAL TEST

```
   INVOKE LFETCH
DONE
DATA PROTOCOL DMOVAM HEX
   DEPOSIT 7E
DONE
SUBR MOVAM              'MOVE MEMORY CON-
                         TENTS AT (POINTER TO
                         BY) HL TO A REG
   INVOKE DMOVAM
   INVOKE FETCH
   INVOKE WRITE         'READ WO/DRIVE
DONE
```

APPENDIX B

PROGRAMMING FOR MMI MODEL PL 14H4

| ADDRESS (Decimal) | DATA (HEX Format) | | | | | | |
|---|---|---|---|---|---|---|---|
| 0–7 | F | F | F | 3 | B | F | F | B |
| 8–15 | 7 | F | F | 7 | F | F | F | F |
| 16–23 | F | F | F | F | F | F | F | F |
| 24–31 | F | F | F | F | F | F | 3 | F |
| 32–39 | F | F | F | 3 | F | B | B | F |
| 40–47 | F | 7 | 7 | F | F | F | F | F |
| 48–44 | F | F | F | F | F | F | F | F |
| 56–63 | F | F | F | F | F | F | 3 | F |
| 64–71 | F | F | 3 | F | B | F | F | F |
| 72–79 | 7 | F | F | F | F | F | F | F |
| 80–87 | F | F | F | F | F | F | F | F |
| 88–95 | F | F | F | F | F | F | 3 | F |
| 96–103 | 3 | 3 | 3 | 3 | 3 | 3 | 3 | 3 |
| 104–111 | 3 | 3 | 3 | 3 | 3 | 3 | F | F |
| 112–119 | 3 | 3 | F | 3 | 3 | 3 | 3 | 3 |
| 120–127 | 3 | 3 | 3 | 3 | 3 | 3 | 3 | 3 |
| 128–135 | 3 | 3 | 3 | 3 | 3 | 3 | 3 | 3 |
| 136–143 | 3 | 3 | 3 | 3 | 3 | 3 | 3 | 3 |
| 144–151 | 3 | 3 | 3 | 3 | 3 | 3 | 3 | 3 |
| 152–159 | 3 | 3 | 3 | 3 | 3 | 3 | 3 | 3 |
| 160–167 | 3 | 3 | 3 | 3 | 3 | 3 | 3 | 3 |
| 168–175 | 3 | 3 | 3 | 3 | 3 | 3 | 3 | 3 |
| 176–183 | 3 | 3 | 3 | 3 | 3 | 3 | 3 | 3 |
| 184–191 | 3 | 3 | 3 | 3 | 3 | 3 | 3 | 3 |
| 192–199 | 3 | 3 | 3 | 3 | 3 | 3 | 3 | 3 |
| 200–207 | 3 | 3 | 3 | 3 | 3 | 3 | 3 | 3 |
| 208–215 | 3 | 3 | 3 | 3 | 3 | 3 | 3 | 3 |
| 216–223 | 3 | 3 | 3 | 3 | 3 | 3 | 3 | 3 |
| 224–431 | 3 | 3 | 3 | 3 | 3 | 3 | 3 | 3 |
| 232–239 | 3 | 3 | 3 | 3 | 3 | 3 | 3 | 3 |
| 240–247 | 3 | 3 | 3 | 3 | 3 | 3 | 3 | 3 |
| 248–255 | 3 | 3 | 3 | 3 | 3 | 3 | 3 | 3 |
| 256–263 | F | F | F | C | F | F | F | F |
| 264–271 | F | F | F | F | F | F | F | F |
| 272–279 | F | F | F | F | E | F | F | E |
| 280–287 | D | F | F | D | F | F | C | F |
| 288–295 | F | F | F | C | F | F | F | F |
| 296–303 | F | F | F | F | F | F | F | F |
| 304–311 | F | F | F | F | F | E | E | F |
| 312–319 | F | D | D | F | F | F | C | F |
| 320–327 | F | F | C | F | F | F | F | F |
| 328–335 | F | F | F | F | F | F | F | F |
| 336–343 | F | F | F | F | E | F | F | F |
| 344–351 | D | F | F | F | F | F | C | F |
| 352–359 | C | C | C | C | C | C | C | C |
| 360–367 | C | C | C | C | C | C | F | C |
| 368–375 | C | C | F | F | C | C | C | C |
| 376–383 | C | C | C | C | C | C | C | C |
| 384–391 | C | C | C | C | C | C | C | C |
| 392–399 | C | C | C | C | C | C | C | C |
| 400–407 | C | C | C | C | C | C | C | C |
| 408–415 | C | C | C | C | C | C | C | C |
| 416–423 | C | C | C | C | C | C | C | C |
| 424–431 | C | C | C | C | C | C | C | C |
| 432–439 | C | C | C | C | C | C | C | C |
| 440–447 | C | C | C | C | C | C | C | C |
| 448–455 | C | C | C | C | C | C | C | C |
| 456–463 | C | C | C | C | C | C | C | C |
| 464–471 | C | C | C | C | C | C | C | C |
| 472–479 | C | C | C | C | C | C | C | C |
| 480–487 | C | C | C | C | C | C | C | C |
| 488–495 | C | C | C | C | C | C | C | C |

APPENDIX B-continued

| PROGRAMMING FOR MMI MODEL PL 14H4 | | | | | | | | |
|---|---|---|---|---|---|---|---|---|
| ADDRESS (Decimal) | DATA (HEX Format) | | | | | | | |
| 496–503 | C | C | C | C | C | C | C | C |
| 504–511 | C | C | C | C | C | C | C | C |

What is claimed is:

1. A circuit for use in an in-circuit digital tester for generating data bus and control input test signals to test electrical components of a circuit under test, the circuit-under-test having a plurality of data bus signal lines, the circuit comprising:
   (a) a data memory responsive to data memory addresses for storing digital signals for generating data bus test signals in data signal sequences defined by a starting and a last data memory address, said stored signals for generating data bus test signals outputted in response to a predetermined sequence of data memory addresses;
   (b) a control memory responsive to control memory addresses for storing digital signals for generating control test signals for a plurality of protocol control sequences in which each control sequence is defined by a plurality of control test signals generated in response to a predetermined sequence of control memory addresses, each control sequence having a starting and a last control memory address;
   (c) a controller means, for generating the predetermined sequences of data and control memory addresses to generate selected ones of the control and data sequences, said controller means selectively enabling the generation of the data bus test signals in a data sequence during a selected control sequence; and
   (d) a driver means associated with each said data and said control memory and responsive to the signal generating data from its associated memory, for generating the data bus and control sequence test signals, said driver means associated with said data memory outputting the data bus test signals when enabled by said controller means.

2. The circuit of claim 1 wherein said data memory and said control memory each comprise:
   (a) a plurality of first memories, each first memory associated with a test signal to be generated and responsive to the memory addresses from said controller means, for storing and outputting digital logic level generating data; and
   (b) a second memory associated with each said first memory and responsive to the addresses from said controller means, for storing and outputting signal level enabling data which enables said digital logic level generating data in the associated said first memory to produce an output signal level from said driver means, said driver means associated with said data memory further enabled by said controller means to enable the logic level and signal level enabling data to generate the data bus test signals.

3. The circuit of claim 2 wherein said controller means further generates a digital mode control signal for controlling the mode of operation of said driver means to
   (a) generate a specific logic level in an output test signal when a specific logic level of the logic level generating data is outputted by said first memory and the mode control signal is at one logic level; and
   (b) generate a logic level transition in an output test signal when a specific logic level of the logic level generating data is outputted by said first memory and the mode control signal is at the opposite logic level.

4. The circuit of claim 1 wherein said controller means comprises:
   (a) a sequence control unit, for executing a sequence of test program instructions whereby the starting addresses for each control sequence and each data sequence to be generated is outputted;
   (b) a control buffer memory unit connected to the output of said sequence control unit, for temporarily storing and outputting in an ordered sequence the starting addresses of the control sequences, said control buffer memory unit generating a control ready command to said sequence control unit when said control buffer memory unit is not full;
   (c) a data buffer memory unit connected to the output of said sequence control unit for temporarily storing and outputting in an ordered sequence the starting addresses of the data sequences, said data buffer memory unit generating a data ready command to said sequence control unit when said data buffer memory unit is not full;
   (d) a control memory address counter responsive to the output from said control buffer memory, for generating the control memory addresses;
   (e) a protocol sequence length memory responsive to the control memory addresses, for outputting signals to enable the generation of the predetermined sequence of control memory addresses;
   (f) a data memory address counter responsive to said protocol sequence length memory and said data buffer memory for generating the data memory addresses;
   (g) a data sequence length memory responsive to the data memory address for outputting a last data sequence address signal to terminate the generation of the sequence of data memory addresses for a selected data sequence;
   (h) a control synchronization means responsive to said protocol length memory and to said control buffer memory unit, for updating said control memory address counter with the starting address of the next protocol sequence to be generated; and
   (i) a data synchronization means responsive to said data sequence length memory and to said data buffer memory unit for updating said data memory address counter with the starting address of the next data sequence to be generated.

5. The circuit of claim 4 wherein said protocol sequence length memory comprises a first random access memory unit which outputs,
   (a) a last control address signal to enable said control memory address counter to load the next protocol sequence starting address from said control buffer memory;
   (b) a data enable signal to selectively enable said data memory to generate the data bus test signals; and
   (c) a data memory address advance signal to enable said data memory address counter to advance to the next data memory address in the predetermined sequence of data memory addresses.

6. The circuit of claims 4 or 5 wherein said data sequence length memory comprises a second random access memory unit which outputs a last data address signal to enable said data memory address counter to load the next data sequence starting address from said data buffer memory when the last address in the selected data sequence has occurred.

7. The circuit of claim 6 wherein said sequence control unit comprises a programmed processor including a third random access memory unit for storing instructions which, when executed by said processor in response to the control ready and data ready commands, outputs the starting addresses of the protocol and data sequences.

8. The circuit of claim 6 wherein said buffer memories are first-in first-out memory units.

9. A circuit adapted for use in an automatic computer controlled in-circuit digital tester for testing a digital microprocessor board, the microprocessor operating through a plurality of data bus and control lines having data and control signals thereon, and where a plurality of basic microprocessor operations each occur in response to a predetermined protocol control sequence of control signals, the circuit comprising:
 (a) a control means responsive to the computer for controlling the generation of the plurality of protocol control and data sequences by generating predetermined sequences of control and data memory addresses;
 (b) a data bus signal generator for controllably generating a plurality of data bus signals in the data bus lines, said data bus signal generator including a data memory,
   said data memory responsive to data memory addresses for storing digital signals for generating data bus test signals in data signal sequences in which each data signal sequence is defined by a starting and a last data memory address, said stored signals for generating data bus test signals outputted in response to a predetermined sequence of data memory addresses; and
 (c) a control signal generator for generating a plurality of protocol sequences of control signals in the control signal lines, said control signal generator including a control memory,
   said control memory responsive to control memory addresses for storing digital signals for generating control test signals for a plurality of protocol control sequences in which each control sequence is defined by a plurality of control test signals generated in response to a predetermined sequence of control memory addresses, each control sequence having a starting and a last control memory address,
   said control means controlling,
   (i) said control signal generator to selectively generate in any desired order the control sequences as a sequence of logic levels in the control signals for each selected control sequence; and
   (ii) said data bus signal generator to selectively generate in any desired order the data sequences as a sequence of logic levels of the data bus signals where each data signal is generated in controlled relationship with the control signals generated during a selected control sequence, said data bus and control signal generators and said control means cooperating to simulate the normal operations of a microprocessor programmed in a specific manner by selectively generating from among the plurality of protocol and data sequences the basic microprocessor operations in any order thereby to test the operations of the microprocessor board.

10. The circuit of claim 9 wherein said data bus signal generator is controlled during a data sequence by a data enable signal from said control means, said data bus signal generator further including a driver means associated with said data memory and responsive to the data bus test signal generating data and the data enable signal for generating the logic levels of the data bus signals.

11. The circuit of claim 9 wherein said control signal generator further includes a driver means associated with said control memory and responsive to said control means and the control line test signal generating data for generating the logic levels in the control line test signals for each protocol sequence.

12. The circuit of claim 10 wherein said data memory comprises:
 (a) a plurality of first memories, each first memory associated with a data bus signal line and responsive to the data memory addresses for storing and outputting digital logic level generating data; and
 (b) a second memory associated with each said first memory and responsive to the data memory addresses for storing and outputting signal level enabling data, the outputted logic level generating data and the signal level enabling data cooperating together to produce said output data bus signals from said associated driver means when said driver means is enabled by said control means.

13. The circuit of claim 11 wherein said control memory comprises:
 (a) a plurality of first memories, each first memory associated with a control line test signal to be generated, and each first memory responsive to the control memory addresses for storing and outputting digital logic level generating data; and
 (b) a second memory associated with each said first memory and responsive to the control memory addresses for storing and outputting signal level enabling data, the outputted logic level generating data and the signal level enabling data cooperating together to produce an output control signal from said associated driver means.

14. The circuit of claims 12 or 13 wherein said control means further generates a digital mode control signal having a first and a second state for controlling the mode of operation of each said associated driver means to,
 (a) generate a specific logic level in an output test signal when a specific logic level of the logic level generating data is outputted by said first memory and the mode control signal is in the first state, and
 (b) generate a logic level transition in an output test signal when a specific logic level of the logic level generating data is outputted by said first memory and the mode control signal is in the second state.

15. The circuit of claim 9 wherein said control means comprises:
 (a) a sequence control unit for executing a sequence of test program instructions whereby the starting addresses for each control sequence and each data signal sequence to be generated is generated;
 (b) a control buffer memory unit connected to the output of said sequence control unit for temporarily storing and outputting in an ordered sequence the starting addresses of the control sequences;

(c) a data buffer memory unit connected to the output of said sequence control unit for temporarily storing and outputting in an ordered sequence the starting addresses of the data sequences;

(d) a control memory address counter responsive to the output from said control buffer memory for generating the control memory addresses;

(e) a protocol sequence length memory responsive to the control memory addresses for outputting signals to enable the generation of the predetermined sequence of control memory addresses;

(f) a data memory address counter responsive to said protocol sequence length memory and said data buffer memory for generating the data memory addresses;

(g) a data sequence length memory responsive to the data memory addresses for outputting signals to enable the generation of the predetermined sequence of control memory addresses;

(h) a control synchronization means responsive to said protocol sequence length memory and to said control buffer memory unit for updating said control memory address counter with the starting address of the next protocol sequence to be generated; and (i) a data synchronization means responsive to said data sequence length memory and to said data buffer memory unit for updating said data memory address counter with the starting address of the next data sequence to be generated.

16. The circuit of claim 15 wherein said protocol sequence length memory comprises a first random access memory unit which outputs:

(a) a last control address signal to enable said control memory address counter to load, the next control sequence starting address from said control buffer memory;

(b) a data enable signal to selectively enable said data memory to generate the data bus test signals; and (c) a data memory address advance signal to enable said data memory address counter to advance to the next data memory address in the predetermined sequence of data memory addresses.

17. The circuit of claims 15 or 16 wherein said data sequence length memory comprises a second random access memory unit which outputs a last data address signal to enable said data memory address counter to load the next data sequence starting address from said data buffer memory when the last address in the selected data sequence is occurring.

18. The circuit of claim 17 wherein said sequence control unit comprises a programmed microprocessor including a third random access memory unit for generating the starting addresses of the protocol and data sequences.

19. The circuit of claim 15 wherein said buffer memories are first-in first-out memory units.

20. Apparatus adapted for use with a central processor for the in-circuit testing during a test cycle of the electrical properties of components interconnected at electrical nodes in a circuit under test, the components being responsive to nodal test vector signals having first, second, and disconnect logic states where a test vector comprises the logic states occurring at any given time in the test cycle in nodal test signals involved in the test of a component, the apparatus comprising:

(a) a test vector processor responsive to said central processor for controlling the generation of said nodal test vector signals during the test cycle; and (b) a plurality of digital test signal means responsive to said test vector processor, (i) each said test signal means capable of generating a nodal test signal to the circuit under test, and (ii) each said test signal means including circuit means for storing test signal generating data and, responsive to said stored test signal generating data, for controlling the generation of each logic state of a nodal test signal, each said test signal means adapted to control the generation of each logic state in each of the following ways, (1) keep the same logic state as the previous logic state, (2) toggle to the opposite state as the previous logic state, or (3) assume either a logic zero or a logic one state regardless of the previous logic state.

21. The apparatus of claim 20 wherein said circuit means also stores enable data for controlling the application of the nodal test signal to the circuit under test, each said test signal means further including a driver means responsive to the nodal test signal from said circuit means and said stored enable data to output the nodal test signal to the circuit under test when enabled by said enable data.

22. The apparatus of claim 21 wherein said vector processor controls the generation of the nodal test signals by generating to each said digital test signal means a sequence of ordered memory addresses, each said circuit means including random access memory for storing said test signal generating data and said enable data, and where N digital test signal means, responsive to stored keep-toggle test signal generating data and said sequence of memory addresses, generate N nodal test signals having $2^N$ unique test vectors where each test vector comprises an N-bit digital code formed from the logic states occurring in the N digital nodal test signals.

23. The apparatus of claim 20 wherein said vector processor comprises a high-speed microcoded processor having a random access program memory for storing microcoded program instructions which are loaded from the central processor prior to a test cycle.

24. Apparatus adapted for use with a central processor for the in-circuit testing during a test cycle of the electrical properties of components interconnected at electrical nodes of a circuit under test, the components being responsive to nodal test signals having first, second, and disconnect logic states, which states occur in clock intervals, the apparatus comprising:

(a) a programmable sequence controller responsive to the central processor for controlling the generation of said nodal test signals during the test cycle, said programmable sequence controller including a high-speed microcoded processor;

(b) a plurality of digital test signal generators, each responsive to said central processor and said controller, and each capable of generating a nodal test signal, each said generator including, (i) a memory means for storing data to generate a nodal test signal and enabling data to control the outputting of a nodal test signal to the circuit under test, (ii) a circuit means responsive to said memory means for generating a flip-flop output signal having said logic states, said circuit means adapted to generate each logic state in each of the following ways,
(1) the logic state remains unchanged from the previous logic state,
(2) the logic state toggles to the opposite logic state as it previous logic state,
(3) the logic state assumes a logic zero state regardless of its previous logic state, or
(4) the logic state assumes a logic one state regardless of its previous logic state; and,
(iii) a driver means responsive to said flip-flop output signal and said test signal enabling data for outputting a nodal test signal to the circuit under test when enabled by said enabling data.

* * * * *